(12) United States Patent
Khalili Amiri et al.

(10) Patent No.: US 9,099,641 B2
(45) Date of Patent: Aug. 4, 2015

(54) SYSTEMS AND METHODS FOR IMPLEMENTING MAGNETOELECTRIC JUNCTIONS HAVING IMPROVED READ-WRITE CHARACTERISTICS

(71) Applicant: THE REGENTS OF THE UNIVERSITY OF CALIFORNIA, Oakland, CA (US)

(72) Inventors: Pedram Khalili Amiri, Los Angeles, CA (US); Kang L. Wang, Santa Monica, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 48 days.

(21) Appl. No.: 14/073,671

(22) Filed: Nov. 6, 2013

(65) Prior Publication Data

US 2014/0124882 A1    May 8, 2014

Related U.S. Application Data

(60) Provisional application No. 61/723,289, filed on Nov. 6, 2012.

(51) Int. Cl.
| | | |
|---|---|---|
| H01L 43/00 | (2006.01) |
| G11C 11/02 | (2006.01) |
| H01L 43/10 | (2006.01) |
| G11C 11/16 | (2006.01) |
| H01L 43/08 | (2006.01) |
| H01L 27/22 | (2006.01) |

(52) U.S. Cl.
CPC .............. *H01L 43/10* (2013.01); *G11C 11/161* (2013.01); *H01L 43/08* (2013.01); *H01L 27/224* (2013.01)

(58) Field of Classification Search
CPC .................. H01L 43/08; H01L 27/222; G11C 11/14–11/16; G11C 11/161
USPC ........... 257/421, E43.004, E27.005; 365/158, 365/171
See application file for complete search history.

(56) References Cited

U.S. PATENT DOCUMENTS

| | | | |
|---|---|---|---|
| 7,057,921 B2 | 6/2006 | Valet | |
| 8,482,968 B2 * | 7/2013 | Worledge | 365/158 |
| 8,841,739 B2 * | 9/2014 | Khalili Amiri et al. | 257/421 |
| 8,885,395 B2 * | 11/2014 | Zhou et al. | 365/158 |
| 8,891,291 B2 * | 11/2014 | Zhou et al. | 365/158 |

(Continued)

FOREIGN PATENT DOCUMENTS

WO    2012/159078 A2    11/2012

*Primary Examiner* — Allison P Bernstein
(74) *Attorney, Agent, or Firm* — John P. O'Banion

(57) ABSTRACT

Embodiments of the invention implement MEJs having improved read-write characteristics. In one embodiment, an MEJ includes: ferromagnetic fixed and free layers, a dielectric layer interposed between the ferromagnetic layers, and an additional dielectric layer proximate the free layer, where the fixed layer is magnetically polarized in a first direction, where the free layer has a first easy axis that is aligned with the first direction, and where the MEJ is configured such that when subject to a potential difference, the magnetic anisotropy of the free layer is altered such that the relative strength of the magnetic anisotropy along a second easy axis that is orthogonal to the first easy axis, compared to the strength of the magnetic anisotropy along the first easy axis, is magnified during the application of the potential difference, where the extent of the magnification is enhanced by the presence of the additional layer.

13 Claims, 19 Drawing Sheets

(56) References Cited

U.S. PATENT DOCUMENTS

| | | |
|---|---|---|
| 2014/0071728 A1 | 3/2014 | Khalili Amiri |
| 2014/0071732 A1 | 3/2014 | Khalili Amiri |
| 2014/0124882 A1 | 5/2014 | Khalili Amiri |
| 2014/0159121 A1* | 6/2014 | Fukami et al. ................ 257/252 |
| 2014/0169085 A1* | 6/2014 | Wang et al. ................... 365/158 |
| 2014/0177327 A1* | 6/2014 | Khalili Amiri et al. ....... 365/158 |
| 2014/0247653 A1* | 9/2014 | Wang et al. ................... 365/158 |

* cited by examiner

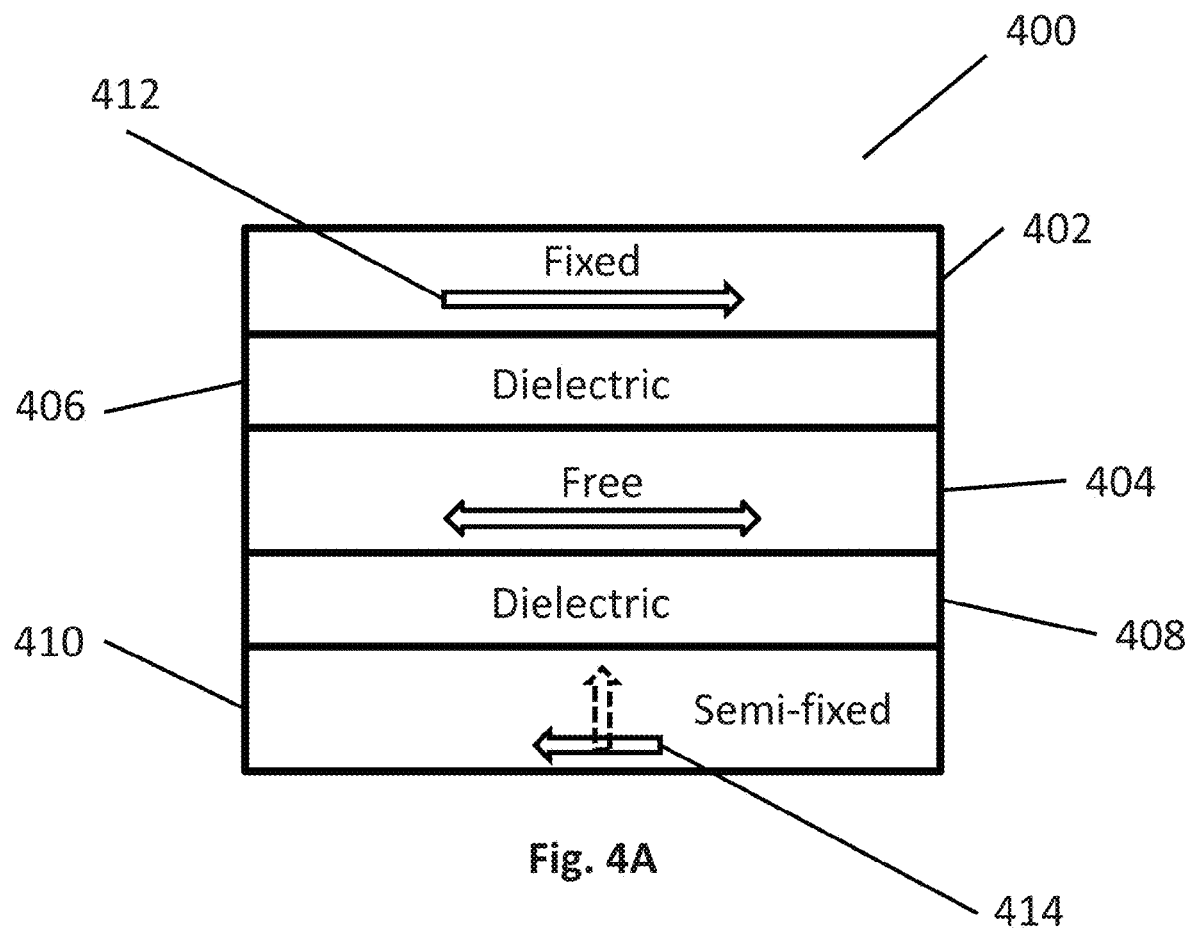

SYSTEMS AND METHODS FOR IMPLEMENTING MAGNETOELECTRIC JUNCTIONS HAVING IMPROVED READ-WRITE CHARACTERISTICS

CROSS-REFERENCE TO RELATED APPLICATIONS

The current application claims priority to U.S. Provisional Application No. 61/723,289, filed Nov. 6, 2012, the disclosure of which is incorporated herein by reference.

FIELD OF THE INVENTION

The present invention generally relates to the implementation of magnetoelectric junctions.

BACKGROUND OF THE INVENTION

Devices that rely on the interplay between electricity and magnetism underlie much of modern electronics. Relatively recently, researchers have begun to develop and implement such devices that take advantage of quantum mechanical magnetoresistance effects, such as giant magnetoresistance (GMR) and tunnel magnetoresistance (TMR). GMR and TMR principles regard how the resistance of a thin film structure that includes alternating layers of ferromagnetic and non-magnetic layers depends upon whether the ferromagnetic layers are in a parallel or antiparallel alignment. For example, magnetoresistive random-access memory (MRAM) is a technology that is being developed that typically utilizes TMR phenomena in providing for alternative random-access memory (RAM) devices. In a typical MRAM bit, data is stored in a magnetic polarization within an arrangement that includes two ferromagnetic plates separated by an insulating layer—this arrangement is conventionally referred to as a magnetic tunnel junction (MTJ). One of the ferromagnetic plates (the fixed layer) is permanently set to a particular polarization, while the other ferromagnetic plate (the free layer) can have its magnetic polarization altered. Generally, the MRAM bit can be written to by manipulating the magnetic polarization of the free layer such that it is either parallel or antiparallel with the polarization of the fixed layer; and the bit can be read by measuring its resistance, since the resistance of the bit will depend on whether the polarizations are in a parallel or antiparallel alignment.

MRAM technologies initially exhibited a number of deficiencies. In particular, they tended to be inefficient since they required a relatively large current to manipulate the magnetic polarization of the bit's free layer. Consequently, adjunct technologies were implemented to mitigate these deficiencies. For example, spin-transfer torque MRAM (STT-MRAM) is a variant of the base MRAM technology whereby the magnetizing current constitutes spin-aligned electrons that are used to directly torque the domains. Additionally, Thermal Assisted Switching MRAM (TAS-MRAM) is yet another variant of MRAM technology whereby the MTJs are heated during the write phase; the heating of the MTJs reduces the current required to polarize the free layer.

Nonetheless, in spite of these advances to MRAM technology and in spite of the many potential advantages that MRAM technology offers, it has yet to achieve widespread adoption. Accordingly, there exists a need to develop more effective electromagnetic configurations that implement magnetoresistance principles such that they can be made to be more viable.

SUMMARY OF THE INVENTION

Systems and methods in accordance with embodiments of the invention implement magnetoelectric junctions having improved read and write characteristics. In one embodiment, a magnetoelectric junction includes: a ferromagnetic fixed layer; a ferromagnetic free layer that is magnetically anisotropic; a first dielectric layer interposed between the ferromagnetic fixed layer and the ferromagnetic free layer; and a second dielectric layer disposed proximate the ferromagnetic free layer; where the ferromagnetic fixed layer is magnetically polarized in a first direction; where the ferromagnetic free layer has a first easy axis that is substantially aligned with the first direction, such that the ferromagnetic free layer can adopt a magnetic polarity that is either parallel with or antiparallel with the first direction; and where the magnetoelectric junction is configured such that when a potential difference is applied across the magnetoelectric junction, the magnetic anisotropy of the ferromagnetic free layer is altered such that the relative strength of the magnetic anisotropy along a second easy axis that is orthogonal to the first easy axis, or the easy plane where there is no easy axis that is orthogonal to the first easy axis, as compared to the strength of the magnetic anisotropy along the first easy axis, is magnified or reduced for the duration of the application of the potential difference; where the extent of the magnification or reduction of the relative strength is enhanced by the presence of the second dielectric layer.

In another embodiment, the first direction coincides with an in-plane direction.

In yet another embodiment, the first direction coincides with an out-of-plane direction.

In still another embodiment, the coercivity of the ferromagnetic free layer is reduced when a potential difference is applied across the magnetoelectric junction.

In still yet another embodiment, the application of a first threshold potential difference across the ferromagnetic fixed layer and the ferromagnetic free layer reduces the coercivity of the ferromagnetic free layer to an extent where the strength of the magnetic field imposed by the ferromagnetic fixed layer is sufficient to cause the ferromagnetic free layer to adopt a magnetic polarity that is determined by that of the ferromagnetic fixed layer.

In a further embodiment, the application of a second threshold potential difference that is greater in magnitude than the first threshold potential difference causes a spin-transfer torque current to flow through the magnetoelectric junction; where the spin-transfer torque current causes the ferromagnetic free layer to adopt a magnetic polarity that is in a direction antiparallel with the first direction.

In a yet further embodiment, a magnetoelectric junction further includes a metal line adjacent to the ferromagnetic free layer, where when a current above a threshold value is passed through the metal line, spin-orbit torques are generated that result in a spin-transfer torque that cause the ferromagnetic free layer to adopt a magnetic polarity in a direction that is based upon the direction of the current.

In a still further embodiment, the ferromagnetic fixed layer includes one of: iron, nickel, manganese, cobalt, FeCoB, FeGaB, FePd, FePt, and mixtures thereof.

In a yet still further embodiment, the ferromagnetic free layer includes one of: iron, nickel, manganese, cobalt, FeCoB, FeGaB, FePd, FePt, and mixtures thereof.

In another embodiment, the first dielectric layer includes one of: $MgO$, $Al_2O_3$, and mixtures thereof.

In yet another embodiment, the second dielectric layer includes one of: MgO, $Al_2O_3$, $HfO_2$, $ZrO_2$, $TiO_2$, $TaO_x$, $GdO_x$, and mixtures thereof.

In still another embodiment, a magnetoelectric junction further includes a layer of material with a large spin-orbit coupling disposed proximate the ferromagnetic free layer and also proximate one of: the first dielectric layer and the second dielectric layer.

In still yet another embodiment, the layer of material with a large spin-orbit coupling is one of: Ta; Hf; Pd; Pt, Gd; the respective oxides of Ta, Hf, Pd, Pt, Gd; and mixtures thereof.

In a further embodiment, a layer of material with a large spin-orbit coupling is disposed proximate the ferromagnetic free layer and also proximate the first dielectric layer; and a second layer of material with a large spin-orbit coupling is disposed proximate the ferromagnetic free layer and also proximate the second dielectric layer.

In a yet further embodiment, a magnetoelectric junction further includes an externally applied magnetic field that is either parallel with or antiparallel with the magnetic polarization of the ferromagnetic fixed layer, where the externally applied magnetic field has a strength sufficient to cause the ferromagnetic free layer to adopt a magnetic polarity in a direction that is parallel with that of the externally applied magnetic field when the coercivity of the ferromagnetic free layer is reduced with the application of a potential difference across the ferromagnetic fixed layer and the ferromagnetic free layer.

In a still further embodiment, a magnetoelectric junction further includes a second ferromagnetic fixed layer, where the second ferromagnetic fixed layer is disposed proximate the second dielectric layer.

In a still yet further embodiment, the ferromagnetic free layer has a first side and an opposing second side, where voltage controlled magnetic anisotropy effects that are manifested at the first side and the opposing second side during the application of the potential difference, are cumulative.

In another embodiment, a magnetoelectric junction includes: a ferromagnetic fixed layer; a ferromagnetic free layer that is magnetically anisotropic; a dielectric layer interposed between the ferromagnetic fixed layer and the ferromagnetic free layer; and a layer of material having a large spin-orbit coupling disposed proximate the dielectric layer and proximate the ferromagnetic free layer; where the ferromagnetic fixed layer is magnetically polarized in a first direction; where the ferromagnetic free layer has a first easy axis that is substantially aligned with the first direction, such that the ferromagnetic free layer can adopt a magnetic polarity that is either parallel with or antiparallel with the first direction; and where the magnetoelectric junction is configured such that when a potential difference is applied across the magnetoelectric junction, the magnetic anisotropy of the ferromagnetic free layer is altered such that the relative strength of the magnetic anisotropy along a second easy axis that is orthogonal to the first easy axis, or the easy plane where there is no easy axis that is orthogonal to the first easy axis, as compared to the strength of the magnetic anisotropy along the first easy axis, is magnified or reduced for the duration of the application of the potential difference; where the extent of the magnification or reduction of the relative strength is enhanced by the presence of the layer of material having a large spin-orbit coupling.

In still another embodiment, the dielectric layer includes one of: MgO, $Al_2O_3$, and mixtures thereof.

In yet another embodiment, the layer of material having a large spin-orbit coupling is one of: Ta; Hf; Pd; Pt, Gd; the respective oxides of Ta, Hf, Pd, Pt, Gd; and mixtures thereof.

BRIEF DESCRIPTION OF THE DRAWINGS

FIGS. 4A and 4B illustrate MEJs that include a semi-fixed layer in accordance with embodiments of the invention.

DETAILED DESCRIPTION

Figure 1:
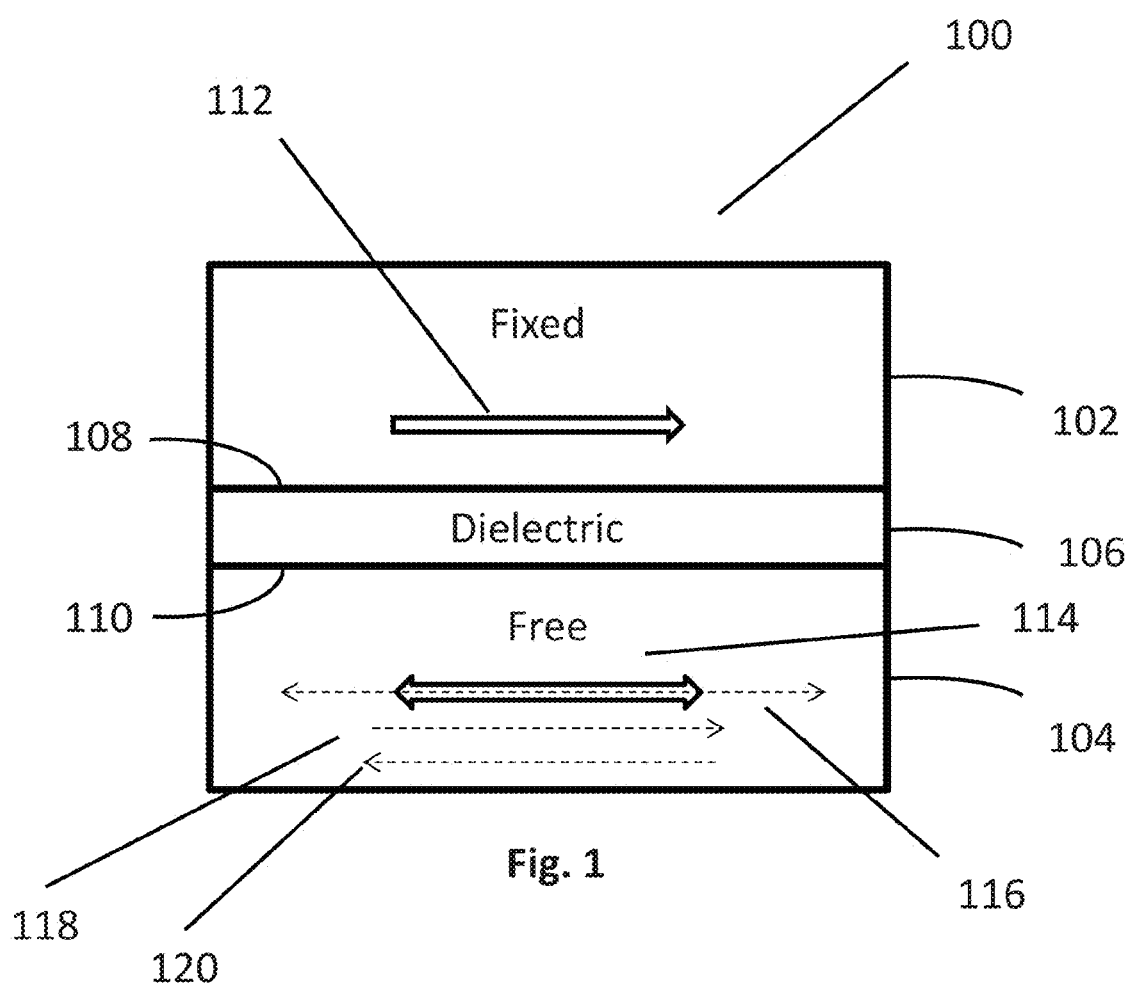
FIG. 1 illustrates an MEJ that includes in-plane anisotropies in accordance with embodiments of the invention.

Turning now to the drawings, systems and methods for implementing magnetoelectric junctions that have improved read and write characteristics are illustrated. In many embodiments, the read and write characteristics of a magnetoelectric junction are improved by implementing a layer of material that enhances the tunnel magnetoresistance (TMR) effects that a magnetoelectric junction generally relies on during the 'reading' aspect of its operation, and a separate layer of material that enhances the voltage controlled-magnetic anisotropy (VCMA) effects that a magnetoelectric junction generally relies on during the 'writing' aspect of its operation. In a number of embodiments, a first dielectric layer is used to enhance the TMR effects, and a second dielectric layer of material is used to enhance the VCMA effects. In some embodiments, a layer of material with a high spin-orbit coupling is used to enhance the VCMA effects.

Previous efforts at implementing electromagnetic components that utilize magnetoresistance phenomena to achieve two information states (i.e. one bit of information), e.g. magnetic tunnel junctions (MTJs), were largely directed at using a current to produce a magnetic field to manipulate the device, and/or directly torqueing the magnetic domains to manipulate the device. However, the currents required were often considerable, particularly in cases where MTJs were used in MRAM configurations. Indeed, in applications that require low-power operation, the requirement of a considerable current made the implementation of devices that rely on MTJs less commercially viable. Accordingly, voltage-controlled magnetic anisotropy-based MTJs (VMTJs) that generally allow MTJs to utilize an electric field to facilitate the imposition of a magnetic polarization onto the free layer (i.e., 'write' to it) as opposed to (or in some cases, in addition to) using a current to do so were developed and reported. See e.g., International Patent Application Number PCT/US2012/038693, International Publication Number WO 2012/159078 A2, entitled "Voltage-Controlled Magnetic Anisotropy (VCMA) Switch and Magneto-electric Memory (MERAM)," by Khalili Amiri et al., the disclosure of which is herein incorporated by reference. Generally, the coercivity of the free layer of an MTJ can be reduced using voltage-controlled magnetic anisotropy (VCMA) phenomena, thereby making the free layer more easily magnetizable ('writeable'). It has been demonstrated that such devices employing VCMA principles result in marked performance improvements over conventional MTJs. Note that in the instant application, the term 'magnetoelectric junction' (MEJ) is used to refer to devices that use VCMA principles to help them realize two distinct information states, e.g. voltage-controlled magnetic anisotropy-based MTJs (VMTJs) as well as the VCMA switches disclosed in International Patent Application Number PCT/US2012/038693, cited above.

In many instances, a fundamental MEJ includes a ferromagnetic fixed layer, a ferromagnetic free layer that is magnetically anisotropic, and a dielectric layer interposed between said ferromagnetic fixed layer and ferromagnetic free layer. The ferromagnetic fixed layer has a fixed magnetic polarization, whereas the ferromagnetic free layer can adopt a magnetic polarity that is either parallel with or antiparallel with the ferromagnetic fixed magnet. In many instances, the application of a potential difference across the MEJ invokes VCMA phenomena and thereby allows the free layer to be 'switched' in a desired direction (i.e. the direction of magnetic polarization can be defined as desired, e.g. either parallel with or antiparallel with the magnetization of the fixed layer); thus, the free layer can adopt a magnetic polarity either parallel with or antiparallel with the polarity of the fixed magnet. In accordance with tunnel magnetoresistance ("TMR") principles, the resistance of the MEJ will vary depending upon whether the free layer adopts a parallel magnetic polarization or an antiparallel magnetic polarization, and therefore, the MEJ can define two information states (i.e. one bit of information). An MEJ can thereby be 'read,' i.e. whether its ferromagnetic layers have magnetic polarizations that are parallel or antiparallel can be determined, by measuring the resistance across it.

Thus, it can be seen that generally, VCMA phenomena can be used to facilitate 'writing' to an MEJ, while TMR effects allow an MEJ to be 'read.' Accordingly, in many embodiments of the invention, MEJs are configured so as to enhance the effect of each of these phenomena to yield MEJs that have improved writing and reading capabilities. For example an interface of the free layer can be developed to enhance VCMA effects, and a material for the insulating layer between the ferromagnetic free and fixed layers can be implemented that magnifies the difference in the resistance across the MEJ when its ferromagnetic layers have magnetic polarizations that are parallel as compared to when they are antiparallel, in accordance with embodiments of the invention.

In many embodiments, a magnetoelectric junction includes: a ferromagnetic fixed layer; a ferromagnetic free layer that is magnetically anisotropic; a first dielectric layer interposed between the ferromagnetic fixed layer and the ferromagnetic free layer; and a second dielectric layer disposed proximate the ferromagnetic free layer. The ferromagnetic fixed layer is magnetically polarized in a first direction, while the ferromagnetic free layer has a first easy axis that is substantially aligned with the first direction, such that the ferromagnetic free layer can adopt a magnetic polarity that is either parallel with or antiparallel with the first direction. The magnetoelectric junction is configured such that when a potential difference is applied across the magnetoelectric junction, the magnetic anisotropy of the ferromagnetic free layer is altered such that the relative strength of the magnetic anisotropy along a second easy axis that is orthogonal to the first easy axis, or the easy plane where there is no easy axis that is orthogonal to the first easy axis, as compared to the strength of the magnetic anisotropy along the first easy axis, is magnified or reduced for the duration of the application of the potential difference, and the extent of the magnification or reduction of the relative strength is enhanced by the presence of the second dielectric layer. Fundamental MEJ structures and their operating principles are now discussed in greater detail.

Fundamental Magnetoelectric Junction Structures

A fundamental MEJ structure typically includes a ferromagnetic (FM) fixed layer, a FM, magnetically anisotropic, free layer (for simplicity, the terms "FM fixed layer" and "fixed layer" will be considered equivalent throughout this application, unless otherwise stated; similarly, the terms "FM, magnetically anisotropic, free layer", "FM free layer", "ferromagnetic free layer," "ferromagnetic free layer that is magnetically anisotropic", FM free layer that is magnetically anisotropic, and "free layer" will also be considered equivalent throughout this application, unless otherwise stated), and a dielectric layer separating the FM fixed layer and FM free layer. Generally, the FM fixed layer has a fixed magnetic polarization, i.e. the direction of magnetic polarization of the FM fixed layer does not change during the operation of the MEJ. Conversely, the FM free layer can be adopt a magnetic polarity that is either parallel with or antiparallel with the FM fixed layer, i.e. during the normal operation of the MEJ, the direction of magnetization can be made to change. For example, the FM free layer may have a magnetic anisotropy, whereby it has an easy axis that is substantially aligned with the direction of magnetic polarization of the FM fixed layer. The easy axis refers to the axis, along which, there is a tendency for the layer to adopt a direction of magnetic polarization. In other words, an easy axis is an energetically favorable direction (axis) of spontaneous magnetization that is determined by the sources of magnetic anisotropy listed below. Relatedly, an easy plane is a plane whereby the direction of magnetization is favored to be within the plane, although there is no bias toward a particular axis within the plane. The easy axis and the direction of magnetic polarization are considered to be 'substantially aligned' when the polarization of the FM free layer can be made to be at least partially parallel or antiparallel to the direction of magnetic polarization of the FM fixed layer to the extent that the underlying principles of magnetoresistance take effect and result in a distinct measurable difference in the resistance of the MEJ as between when the magnetic polarizations of the FM layers are parallel relative to when they are antiparallel, e.g. such that two distinct information states can be defined.

VCMA phenomena can be relied on in switching the FM free layer's characteristic magnetic polarization, i.e. the MEJ can be configured such that the application of a potential difference across the MEJ generally augments the FM free layer's magnetic anisotropy, and relatedly reduces its coercivity. Accordingly, with a reduced coercivity, the FM free layer can be subject to magnetization that can make it parallel with or antiparallel with the direction of magnetic polarization for the FM fixed layer. A more involved discussion regarding the general operating principles of an MEJ is presented in the following section.

Notably, the direction of magnetic polarization, and the related characteristics of magnetic anisotropy, can be established for the FM fixed and FM free layers using any suitable method. For instance, the shapes of the constituent FM fixed layer, FM free layer, and dielectric layer, can be selected based on desired magnetic polarization orientations. For example, implementing FM fixed, FM free, and dielectric layers that have an elongated shape, e.g. have an elliptical cross-section, may tend to induce magnetic anisotropy that is in the direction of the length of the elongated member—i.e. the FM fixed and FM free layers will possess a tendency to adopt a direction of magnetic polarization along the length of the elongated member. In other words, the direction of the magnetic polarization is 'in-plane'. Alternatively, where it is desired that the magnetic anisotropy have a directional component that is perpendicular to the FM fixed and FM free layers (i.e., 'out-of-plane'), the shape of the layers can be made to be symmetrical, e.g. circular, and further the FM layers can be made to be thin. In this case, while the tendency of the magnetization to remain in-plane may still exist, it may not have a preferred directionality within the plane of the layer, and thus the layer may define an easy plane insofar as there is an anisotropic tendency within the plane of the layer although there is no preferred axis of magnetization within the plane. Where the FM layers are relatively thinner, the anisotropic effects that result from interfaces between the FM layers and any adjacent layers, which tend to be out-of-plane, may tend to dominate the overall anisotropy of the FM layer. Alternatively, a material may be used for the FM fixed or free layers which has a bulk perpendicular anisotropy, i.e. an anisotropy originating from its bulk (volume) rather than from its interfaces. The FM free or fixed layers may also consist of a number of sub-layers, with the interfacial anisotropy between individual sub-layers giving rise to an effective bulk anisotropy to the material as a whole. Additionally, FM free or fixed layers may be constructed which combine these effects, and for example have both interfacial and bulk contributions to perpendicular anisotropy.

FIG. 1 illustrates an MEJ whereby the FM fixed layer and the FM free layer are separated by, and directly adjoined to, a dielectric layer. In particular, in the illustrated embodiment, the MEJ 100 includes an FM fixed layer 102 that is adjoined to a dielectric layer 106, thereby forming a first interface 108; the MEJ further includes an FM free layer 104 that is adjoined to the dielectric layer 106 on an opposing side of the first interface 108, and thereby forms a second interface 110. The MEJ 100 has an FM fixed layer 102 that has a magnetic polarization 112 that is in-plane, and depicted in the illustration as being from left to right. Accordingly, the FM free layer is configured such that it can adopt a magnetic polarization 114 that is either parallel with or antiparallel with the magnetic polarization of the FM fixed layer. For reference, the easy axis 116 is illustrated, as well as the direction of a parallel magnetic polarization 118, and an antiparallel magnetic polarization 120. Additional contacts (capping or seed materials, or multilayers of materials, not shown) may be attached to the FM free layer 104 and the FM fixed layer 102, thereby forming additional interfaces. The contacts both contribute to the electrical and magnetic characteristics of the device by providing additional interfaces, and can also be used to apply a potential difference across the device. Additionally, it should of course be understood that MEJs can include metallic contacts that can allow them to interconnect with other electrical components.

Importantly, by appropriately selecting the materials, the MEJ can be configured such that the application of a potential difference across the FM fixed layer and the FM free layer can modify the magnetic anisotropy of the FM free layer. For example, whereas in FIG. 1, the magnetic anisotropy of the FM free layer is depicted as being in-plane, the application of a voltage may distort the magnetic anisotropy of the FM free layer such that it includes a component that is at least partially out of plane. The particular dynamics of the modification of the magnetic anisotropy will be discussed below in the section entitled "MEJ Operating Principles." Suitable materials for the FM layers such that this effect can be implemented include iron, nickel, manganese, cobalt, FeCoB, FeGaB, FePd, and FePt; further, any compounds or alloys that include these materials may also be suitable. Suitable materials for the dielectric layer include MgO and $Al_2O_3$. Of course, it should be understood that the material selection is not limited to those recited—any suitable FM material can be used for the FM fixed and free layers, and any suitable material can be used for the dielectric layer. It should also be understood that each of the FM free layer, FM fixed layer, and dielectric layer may consist of a number of sub-layers, which acting together provide the functionality of the respective layer.

Figure 2:
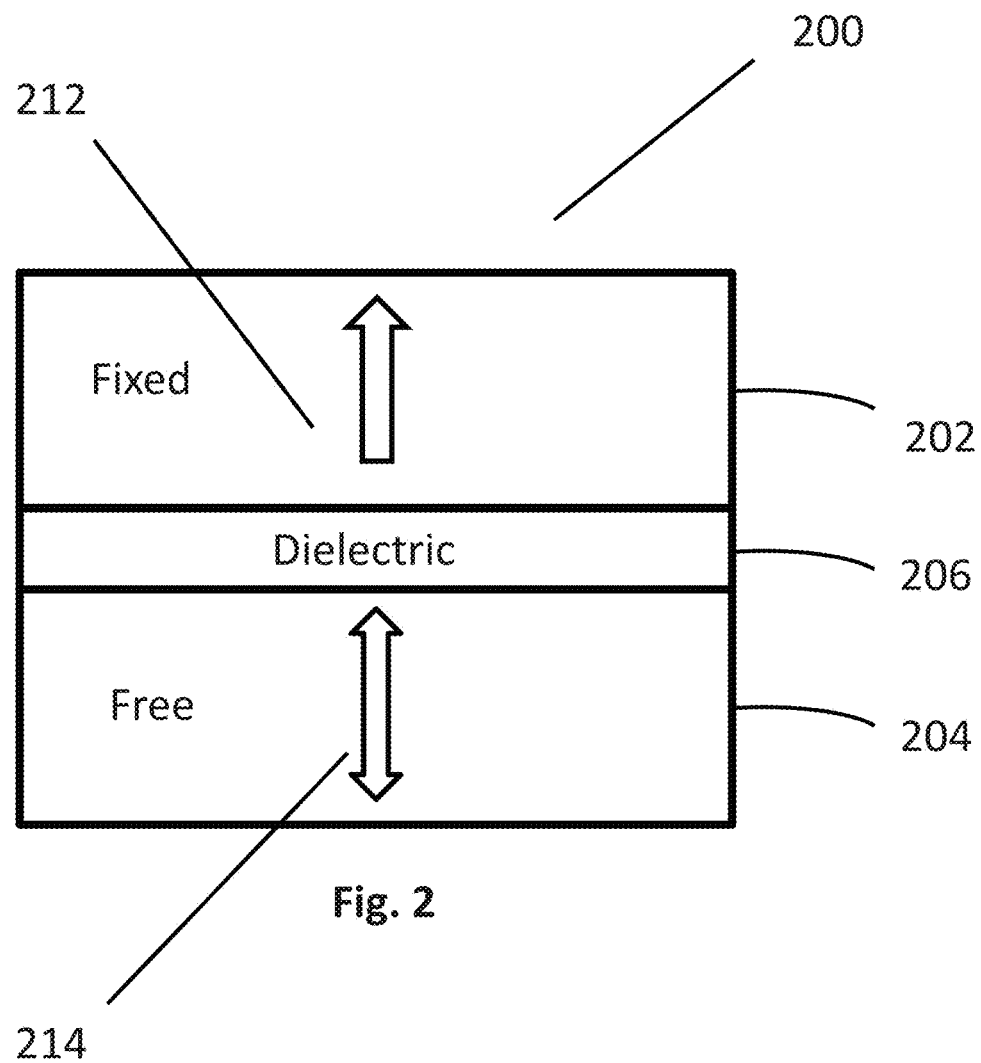
FIG. 2 illustrates an MEJ that includes out-of-plane anisotropies in accordance with embodiments of the invention.

FIG. 2 illustrates an MEJ whereby the orientation of the magnetic polarizations is perpendicular to the plane of the constituent layers. In particular, the MEJ 200 is similarly configured to that seen in FIG. 1, with an FM fixed layer 202 and an FM free layer 204 adjoined to a dielectric layer 206. However, unlike the MEJ in FIG. 1, the magnetic polarizations of the FM fixed and FM free layers, 212 and 214 respectively, are oriented perpendicularly to the layers of the MEJ. Additional contacts (capping or seed materials, or multilayers of materials, not shown) may be attached to the FM free layer 204 and the FM fixed layer 202, thereby forming additional interfaces. The contacts both contribute to the electrical and magnetic characteristics of the device by providing additional interfaces, and can also be used to apply a potential difference across the device. It should also be understood that each of the FM free layer, FM fixed layer, and dielectric layer may consist of a number of sub-layers, which acting together provide the functionality of the respective layer.

Of course, it should be understood that the direction of magnetic polarization for the FM layers can be in any direction, as long as the FM free layer can adopt a direction of magnetic polarization that is either parallel with or antiparallel with the direction of magnetic polarization of the FM fixed layer, or contains a polarization component that is either parallel or anti-parallel with the direction of magnetic polarization of the FM fixed layer. For example, the direction of magnetic polarization can include both in-plane and out-of-plane components.

Indeed, it has been observed that where the in-plane and out-of-plane anisotropies are relatively similar, thereby resulting in an overall anisotropy that has anisotropic components in-plane and out-of-plane, an MEJ is most sensitive to VCMA principles and can thereby be advantageous.

In many instances, an MEJ includes additional adjunct layers that function to facilitate the operation of the MEJ. For example, in many instances, the FM free layer includes a capping or seed layer, which can (1) help induce greater electron spin perpendicular to the surface of the layer, thereby increasing its perpendicular magnetic anisotropy, and/or (2) can further enhance the sensitivity to the application of an electrical potential difference.

Figure 3:
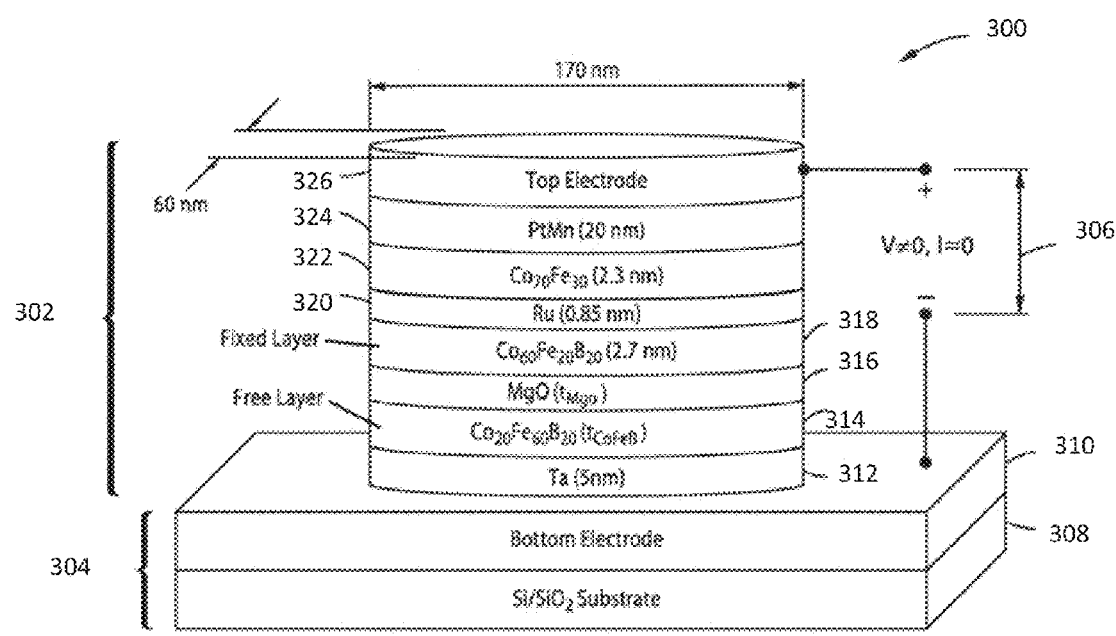
FIG. 3 illustrates an MEJ that includes adjunct layers to facilitate its operation in accordance with embodiments of the invention.

FIG. 3 illustrates an MEJ 300 that includes multiple layers that work in aggregate to facilitate the functionality of the MEJ 300. A pillar section 302 extends from a planar section 304. A voltage is shown being applied 306 between the top and bottom of the pillar. By way of example, an Si/SiO2 substrate 308 is seen over which is a bottom electrode 310. The pillar 302 comprises the following layers in order: Ta 312 (e.g., 5 nm in thickness); a free layer 314 preferably comprising an Fe-rich CoFeB material (e.g. $Co_{20}Fe_{60}B_{20}$ having a thickness generally ranging from, but not limited to, 0.8 nm-1.6 nm); a dielectric layer 316 comprising a dielectric oxide such as MgO or $Al_2O_3$ having a thickness of approximately, but not limited to, 0.8-1.4 nm); a FM fixed layer 318 preferably comprising a CoFeB material (e.g. $Co_{60}Fe_{20}B_{20}$ having a thickness of approximately, but not limited to, 2.7 nm); a metal layer (e.g. Ru 320 having a thickness of approximately, but not limited to, 0.85 nm) to provide antiferromagnetic inter-layer exchange coupling; an exchange-biased layer 322 of $Co_{70}Fe_{30}$ (e.g., thickness of approximately, but not limited to, 2.3 nm), the magnetization orientation of which is pinned by exchange bias using an anti-ferromagnetic layer 324, e.g. PtMn, IrMn, or a like material having a thickness of approximately, but not limited to, 20 nm); and a top electrode 326. By way of example and not limitation, the pillar of the device depicted is in the shape of a 170 nm×60 nm elliptical nanopillar. In this illustration, Ta layer 312 is used as a seed layer to help induce a larger magnitude of electron spin and/or enhance the electric-field sensitivity of magnetic properties (such as anisotropy) in the FM free layer. It also acts as a sink of B atoms during annealing of the material stack after deposition, resulting in better crystallization of the FM free layer and thereby increasing the TMR effect. Of course any suitable materials can be used as a capping or seed layer 312; for example, materials based on Ruthenium, hafnium, and palladium, may be used. More generally, any adjunct layers that can help facilitate the proper functioning of the MEJ can be implemented in an MEJ.

MEJs can also include a semi-fixed layer which has a magnetic anisotropy that is altered by the application of a potential difference. In many instances the characteristic magnetic anisotropy of the semi-fixed layer is a function of the applied voltage. For example in many cases, the direction of the orientation of the magnetic anisotropy of the semi-fixed layer is oriented in the plane of the layer in the absence of a potential difference across the MEJ. However, when a potential difference is applied, the magnetic anisotropy is altered such that it includes a strengthened out-of-plane anisotropy. Moreover, the extent to which the magnetic anisotropy of the semi-fixed layer is modified as a function of applied voltage can be made to be less than the extent to which the magnetic anisotropy of the FM free layer is modified as a function of applied voltage. The incorporation of a semi-fixed layer can facilitate a more nuanced operation of the MEJ (to be discussed below in the section entitled "MEJ Operating Principles").

Figure 4B:
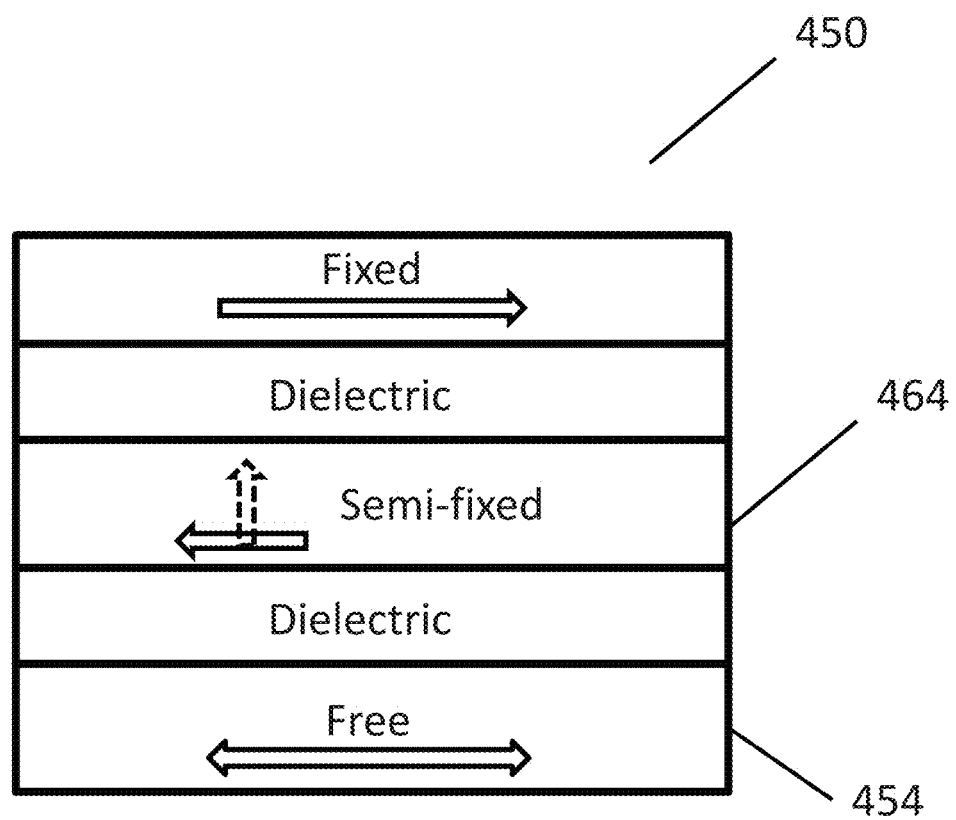

FIG. 4A illustrates an MEJ that includes a semi-fixed layer. In particular, the configuration of the MEJ 400 is similar to that depicted in FIG. 1, insofar as it includes an FM fixed layer 402 and an FM free layer 404 separated by a dielectric layer 406. However, the MEJ 400 further includes a second dielectric layer 408 adjoined to the FM free layer 404 such that the FM free layer is adjoined to two dielectric layers, 406 and 408 respectively, on opposing sides. Further, a semi-fixed layer 410 is adjoined to the dielectric layer. Typically, the direction of magnetic polarization of the semi-fixed layer 414 is anti-parallel with that of the FM fixed layer 412. As mentioned above, the direction of magnetic polarization of the semi-fixed layer can be manipulated based on the application of a voltage. In the illustration, it is depicted that the application of a potential difference adjusts the magnetic anisotropy of the semi-fixed layer such that the strength of the magnetic anisotropy along a direction orthogonal to the initial direction of magnetization polarization is developed. It should of course be noted that the application of a potential difference can augment the magnetic anisotropy in any number of ways; for instance, in some MEJs, the application of a potential difference can reduce the strength of the magnetic anisotropy in a direction orthogonal to the initial direction of polarization. Note also that in the illustration, the directions of magnetic polarizations are all depicted to be in-plane where there is no potential difference. However, of course it should be understood that the direction of the magnetic polarization can be in any suitable direction. More generally, although a particular configuration of an MEJ that includes a semi-fixed layer is depicted, it should of course be understood that a semi-fixed layer can be incorporated within an MEJ in any number of configurations. For example, FIG. 4B illustrates an MEJ that includes a semi-fixed layer that is in a different configuration than that seen in 4A. In particular, the MEJ 450 is similar to that seen in FIG. 4A, except that the positioning of the semi-fixed layer 464 and the free layer 454 is inverted. In certain situations, such a configuration may be more desirable.

The general principles of the operation of an MEJ are now discussed.

General Principles of MEJ Operation

MEJs generally function to achieve two distinct information states using the principles of magnetoresistance. As mentioned above, magnetoresistance principles regard how the resistance of a thin film structure that includes alternating layers of ferromagnetic and non-magnetic layers depends upon whether the ferromagnetic layers are in a parallel or antiparallel alignment. Thus, an MEJ can achieve a first information state where its FM layers have magnetic polarizations that are parallel, and a second information state where its FM layers have magnetic polarizations that are antiparallel. MEJs further rely on voltage-controlled magnetic anisotropy (VCMA) phenomena. Generally, VCMA phenomena regard how the application of a voltage to a ferromagnetic material that is adjoined to an adjacent dielectric layer can impact the characteristics of the ferromagnetic material's magnetic anisotropy. For example, it has been demonstrated that the interface of oxides such as MgO with metallic ferromagnets such as Fe, CoFe, and CoFeB can exhibit a large perpendicular magnetic anisotropy which is furthermore sensitive to voltages applied across the dielectric layer, an effect that has been attributed to spin-dependent charge screening, hybridization of atomic orbitals at the interface, and to the electric field induced modulation of the relative occupancy of atomic orbitals at the interface. MEJs can exploit this phenomenon to achieve two distinct information states. For example, MEJs can employ one of two mechanisms to do so: first, MEJs can be configured such that the application of a potential difference across the MEJ functions to reduce the coercivity of the FM free layer, such that it can be subject to magnetization in a desired polar direction, i.e. either parallel with or antiparallel with the polarization direction of the fixed layer; second, MEJ operation can rely on precessional switching (or resonant switching), whereby by precisely subjecting the MEJ to voltage pulses of precise widths, the direction of magnetic polarization of the FM free layer can be made to switch.

In many instances, MEJ operation is based on reducing the coercivity of the FM free layer such that it can adopt a direction of magnetic polarity in a desired direction. With a reduced coercivity, the FM free layer can adopt a direction of magnetic polarity in any suitable way. For instance, the magnetization can result from: an externally applied magnetic field, the magnetic field of the FM fixed layer; the application of a spin-transfer torque (STT) current; the magnetic field of a FM semi-fixed layer; the application of a current in an adjacent metal line inducing a spin-orbit torque (SOT); and any combination of these mechanisms, or any other suitable method of magnetizing the FM free layer with a reduced coercivity.

By way of example and not limitation, examples of suitable ranges for the externally applied magnetic field are in the range of 0 to 100 Oe. The magnitude of the electric field applied across the device to reduce its coercivity or bring about resonant switching can be approximately in the range of 0.1-2.0 V/nm, with lower electric fields required for materials combinations that exhibit a larger VCMA effect. The magnitude of the STT current used to assist the switching may be in the range of approximately 0.1-1.0 MA/cm$^2$.

Figure 5A:
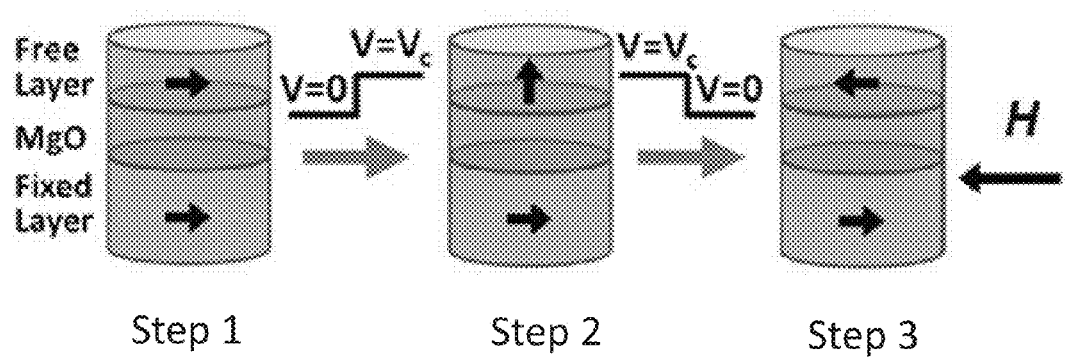
FIGS. 5A and 5B illustrate the operation of an MEJ in accordance with embodiments of the invention.

FIG. 5A depicts how the application of a potential difference can reduce the coercivity of the free layer such that an externally applied magnetic field H can impose a direction of magnetic polarity on the free layer. In the illustration, in step 1, the FM free layer and the FM fixed layer have a magnetic polarization that is substantially in plane; the FM free layer has a magnetic polarization direction that is parallel with that of the FM fixed layer. Further, in Step 1, the coercivity of the FM free layer is such that the FM free layer is not prone to having its direction of magnetic polarization reversed by the magnetic field H, which is in a direction antiparallel with the polarization direction of the FM fixed layer. However, a Voltage, $V_c$ is then applied, which results in step 2, where the voltage $V_c$ has modified the magnetic anisotropy of the free layer such that the strength of the magnetic anisotropy along an easy axis that is orthogonal to the initial easy axis is magnified. Correspondingly, the coercivity of the FM free layer is reduced such that it is subject to magnetization by an in-plane magnetic field H. Accordingly, when the potential difference $V_c$ is removed, VCMA effects are removed and the magnetic field H causes the FM free layer to adopt a direction of magnetic polarization that is antiparallel with the polarization of the FM fixed layer. Hence, as the MEJ now includes an FM fixed layer and an FM free layer that have magnetic polarizations that are antiparallel, it reads out a second information state (resistance value) different from the first. It should be understood that in many embodiments, the application of a voltage reduces the strength of the magnetic anisotropy along the easy axis; in this way the relative strength of the magnetic anisotropy along the orthogonal direction can be enhanced, and the coercivity can be correspondingly reduced such that the FM free layer can be caused to adopt a particular direction of magnetic polarization. In general, it can be seen that by controlling the potential difference and the direction of an applied magnetization, an MEJ switch can be achieved.

Figure 5B:
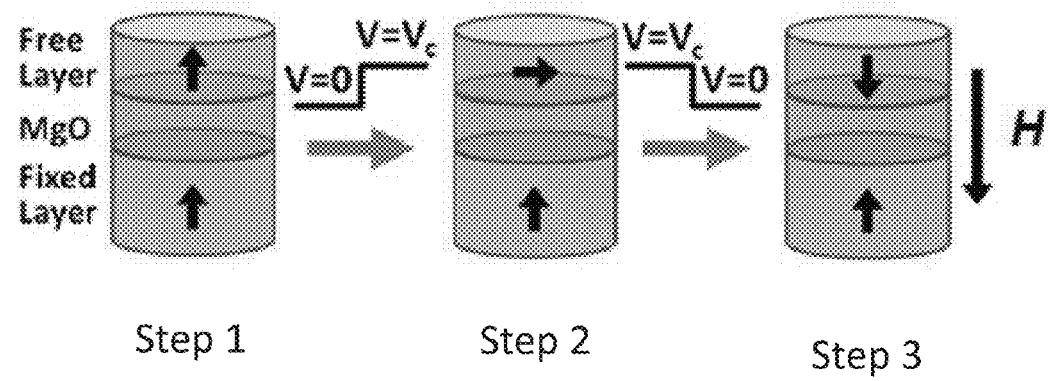

It should of course be understood that the direction of the FM fixed layer's magnetic polarization need not be in-plane—it can be in any suitable direction. For instance, it can be substantially out of plane. Additionally, the FM free layer can include magnetic anisotropies that are both in-plane and out-of-plane; indeed, in many instances, it has been observed that the coercivity is most sensitive to the application of voltage when the in-plane anisotropy and out-of-plane anisotropy are of relatively similar strengths. FIG. 5B depicts a corresponding case relative to FIG. 5A when the FM fixed and FM free layers have directions of magnetic polarization that are perpendicular to the layers of the MEJ (out-of-plane). It is of course important, that an FM, magnetically anisotropic, free layer be able to adopt a magnetic polarization direction that is either substantially parallel with an FM fixed layer, or substantially antiparallel with an FM fixed layer. In other words, when unburdened by a potential difference, the easy axis of the FM free layer should be aligned with the direction of magnetic polarization, such that the FM free layer can adopt a direction of polarization that is either parallel with or antiparallel with the direction of the FM fixed layer's polarization, to the extent that a distinct measurable difference in the resistance of the MEJ that results from the principles of magnetoresistance as between the two states (i.e. parallel alignment vs. antiparallel alignment) can be measured, such that two distinct information states can be defined.

Note of course that the application of an externally applied magnetic field is not the only way for the MEJ to take advantage of reduced coercivity upon application of a potential difference. For example, the magnetic polarization of the FM fixed layer can be used to impose a direction of magnetic polarization on the free layer when the free layer has a reduced coercivity. Moreover, an MEJ can be configured to receive a spin-transfer torque (STT) current when application of a voltage causes a reduction in the coercivity of the FM free layer. Generally, STT current is a spin-polarized current that can be used to facilitate the imposition of a magnetic polarization on a ferromagnetic layer. It can originate, for example, from a current passed directly through the MEJ device, such as due to leakage when a voltage is applied, or it can be created by other means, such as by spin-orbit-torques (e.g., Rashba or Spin-Hall Effects) when a current is passed along a metal line placed adjacent to the FM free layer. Accordingly, the STT current can then help cause the FM free layer to adopt a particular magnetic polarization, where the direction of the spin determines the direction of magnetization. This configuration is advantageous over conventional STT-RAM configurations since the reduced coercivity of the FM free layer reduces the amount of current required to cause the FM free layer to adopt a particular magnetic polarization direction, thereby making the device more energy efficient.

Figure 6:
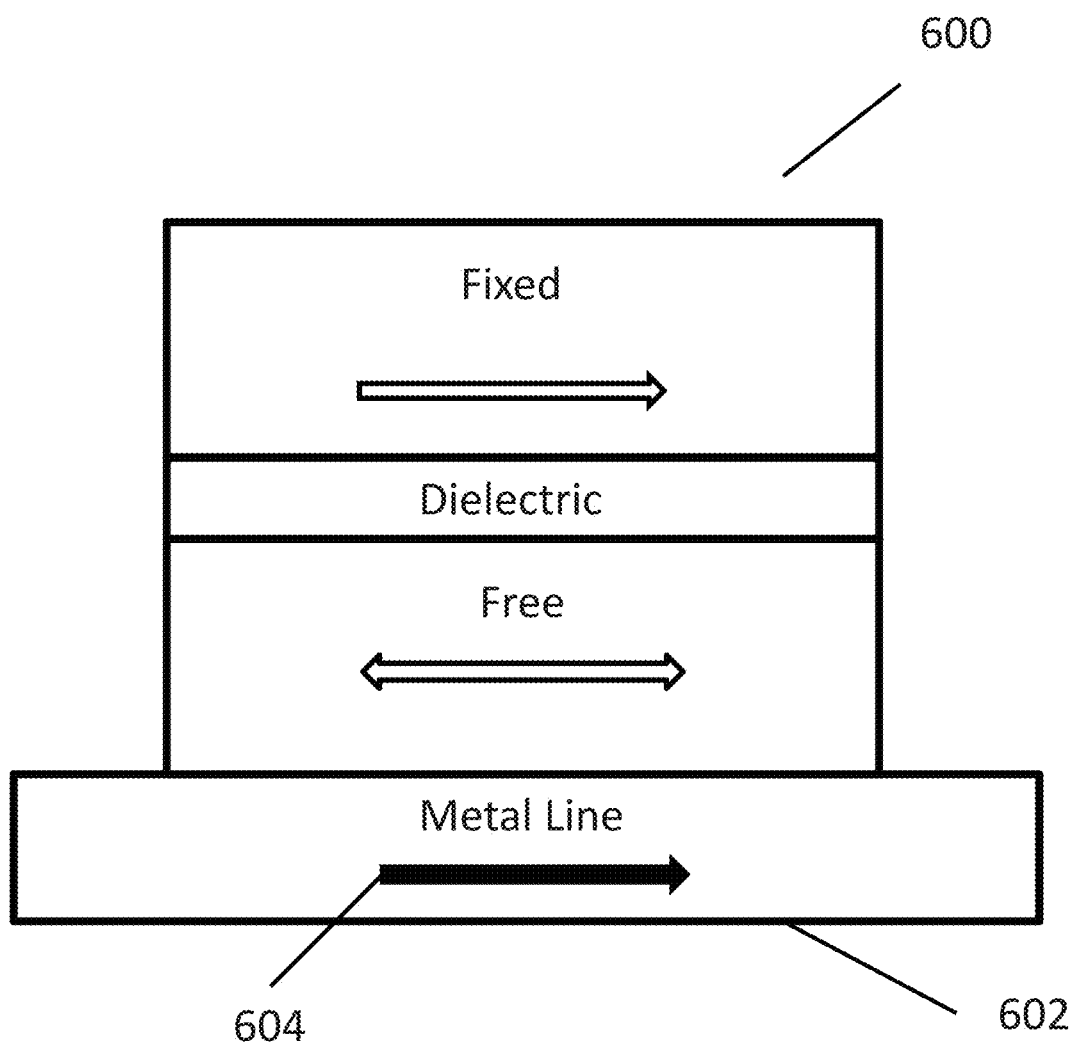
FIG. 6 illustrates an MEJ having a metal line parallel to and proximate the free layer where current can pass through the metal line and thereby induce spin-orbit torques that can result in a spin-transfer torque that can cause the ferromagnetic free layer to adopt a particular magnetic polarity in accordance with embodiments of the invention.

FIG. 6 depicts using a metal line disposed adjacent to an FM free layer to generate spin-orbit torques that can result in a spin-transfer torque that can impose a magnetic polarization on the FM free layer. In particular, the MEJ 600 is similar to that seen in FIG. 1, except that it further includes a metal line 602, whereby a current 604 can flow to induce spin-orbit torques that can result in spin-transfer torques, which can thereby help impose a magnetic polarization on the ferromagnetic free layer.

Additionally, in many instances, an MEJ cell can further take advantage of thermally assisted switching (TAS) principles. Generally, in accordance with TAS principles, heating up the MEJ during a writing process reduces the magnetic field required to induce switching. Thus, for instance, where STT is employed, even less current may be required to help impose a magnetic polarization on a free layer, particularly where VCMA principles have been utilized to reduce its coercivity.

Moreover, the switching of MEJs to achieve two information states can also be achieved using voltage pulses. In particular, if voltage pulses are imposed on the MEJ for a time period that is one-half of the precession of the magnetization of the free layer, then the magnetization may invert its polarity. Using this technique, ultrafast switching times, e.g. below 1 ns, can be realized; moreover, using voltage pulses as opposed to a current, makes this technique more energetically efficient as compared to the precessional switching induced by STT currents, as is often used in STT-RAM. However, this technique is subject to the application of a precise pulse that is half the length of the precessional period of the magnetization layer. For instance, it has been observed that pulse durations in the range of 0.05 to 3 nanoseconds can reverse the magnetic polarization. Additionally, the voltage pulse must be of suitable amplitude to cause the desired effect, e.g. reverse the direction of magnetic polarization.

Against this background, it can be seen that MEJs can confer numerous advantages relative to conventional MTJs. For example, they can be controlled using voltages of a single polarity—indeed, U.S. patent application Ser. No. 14/021, 916 entitled "Systems and Methods for Implementing Magnetoelectric Junctions," to Khalili Amiri et al. discusses using diodes, in lieu of transistors, as access devices to the MEJ, and this configuration is enabled because MEJs can be controlled using voltages of a single polarity. The disclosure of U.S. patent application Ser. No. 14/021,916 is incorporated herein by reference.

In accordance with embodiments of the current invention, MEJ configurations are implemented that enhance the effects of the VCMA phenomena and magnetoresistance principles relied on during MEJ operation to improve the writeability and readability of the MEJ, and this aspect is now discussed below.

Improving the Writeability and Readability of MEJs

As can be determined from the above discussion, MEJ operation is largely premised on VCMA phenomena and the principles of magnetoresistance. In particular, VCMA phenomena is relied on to facilitate magnetizing the free layer, i.e. to write to the MEJ, while 'reading' the MEJ is based on principles of magnetoresistance. Accordingly, in many embodiments of the invention, an MEJ is configured to enhance these two aspects that underlie MEJ operation.

Generally, VCMA phenomena is used to facilitate writing to an MEJ (e.g. by reducing the coercivity of the free layer to an extent where it can more easily have a magnetic polarization imposed on it), and is typically implemented in an MEJ by developing the interface of a free layer. For example, when an FM free layer is adjoined to a dielectric layer, e.g. MgO or $Al_2O_3$, the interfacial effects between the free layer and the dielectric layer can result in a large perpendicular magnetic anisotropy, which is additionally sensitive to voltages applied across the MEJ. Thus, where the ferromagnetic layer has an in-plane easy axis and where a potential difference is applied across the MEJ, the perpendicular magnetic anisotropy resulting from interfacial effects can further develop, and reduce the coercivity of the FM free layer. Hence, the free layer can be made to be more willing to adopt a particular magnetic polarization. As alluded to in the above discussions, a similar effect can be achieved for a free layer which has a perpendicular easy axis, where application of a potential difference across the MEJ reduces the perpendicular anisotropy along this easy axis, reducing the free layer coercivity, hence making it more susceptible to the imposition of a magnetic polarization. This effect has been attributed to spin-dependent charge screening, orbital hybridization at the interface, and to the electric-field-induced modulation of the relative occupancy of different orbitals at the interface. Conventional MEJs have relied on the dielectric layer separating the free and fixed layers to implement this effect. However, in many embodiments of the current invention, a second dielectric layer, distinct from the dielectric layer separating the free and fixed layers, is disposed proximate the free layer and is used to implement the VCMA effect. In this way, interfacial effects can be developed separately, and thereby tuned separately, from the other functionality provided by the dielectric layer separating the free and fixed layers. With a greater VCMA effect, a free layer can be more susceptible to the imposition of a magnetic polarization even using a potential difference of a relatively lesser magnitude. Hence, a more efficient MEJ can be developed. In many embodiments, the second dielectric material is one of $HfO_2$, $ZrO_2$, $TiO_2$, $TaO_x$, $GdO_x$, and mixtures thereof. In some instances, the second dielectric material comprises one of: MgO and $Al_2O_3$. Of course any suitable material that provides for enhanced VCMA effects can be used in accordance with embodiments of the invention.

Generally, dielectric materials that have larger dielectric constants tend to induce larger VCMA effects. Thus, in many embodiments, a dielectric material is selected for implementation within an MEJ as the second dielectric material based on its dielectric constant. Similarly, ferroelectric materials may be used as the second dielectric due to their large induced surface charge density. Additionally, VCMA effects tend to be fairly sensitive to various interfacial properties, e.g., the oxygen content at the interface, and the associated presence of metal-oxygen bonds (e.g. Fe—O bonds if the free layer contains iron). Note that the oxygen presence can be controlled, for example by heat treating the free layer. Accordingly, in many embodiments the free layer has been heat treated to develop a desired oxygen presence at its surface so as to enhance VCMA effects. Other factors that influence VCMA effects are the spin-orbit coupling (a fundamental materials-level parameter) of the materials near the interface. Thus, in many embodiments, thin layers, e.g. 1-10 atomic layers, of materials with a large spin-orbit coupling—such as Ta, Hf, Pd, Pt, Gd, or their respective oxides—could be inserted at the interface to increase VCMA effects. Of course, it should be understood that although 1-10 atomic layers are referenced, any suitable amount of material with large spin-orbit coupling can be inserted at the interface to enhance VCMA effects in accordance with embodiments of the invention. Similarly, although four examples of elements having large spin-orbit coupling are recited, any suitable element having large spin-orbit coupling can be implemented in accordance with embodiments of the invention. More generally, any suitable material(s) can be inserted between the second dielectric layer and the free metal to increase the VCMA effects in accordance with embodiments of the invention.

As mentioned previously MEJs are read using the principles of magnetoresistance. In particular, the reading of MEJs is typically based on tunnel magnetoresistance phenomena (TMR). As mentioned previously, in this context, TMR phenomena regards how the resistance across an MEJ will vary based on whether its ferromagnetic layers are in a parallel or antiparallel alignment. In order to improve the readability of the MEJ, it is beneficial to have the resistance values between the two states (i.e. where the ferromagnetic layers have parallel magnetic polarizations vs. when they have antiparallel magnetic polarizations) be sufficiently different. The quality of the reading process is typically assessed by determining the difference in the resistance of the MEJ when the FM layers have parallel magnetic polarizations and when they have antiparallel magnetic polarizations, and normalizing it against the resistance of the MEJ when the ferromagnetic layers have magnetic polarizations that are parallel, i.e.

$$\text{TMR} = (R_{AP} - R_P)/R_P, \qquad \text{Eq. 1}$$

where $R_{AP}$ is the resistance of the MEJ when the ferromagnetic layers have magnetic polarizations that are antiparallel and $R_P$ is the resistance of the MEJ when the ferromagnetic layers have magnetic polarizations that are parallel.

Accordingly, in many embodiments, an MEJ includes a second dielectric layer disposed proximate the free layer, which is used to implement the VCMA effect within the MEJ; in this way a dielectric layer separating the free and fixed layers can be implemented in the MEJ that enhances the TMR effects, i.e. that increases the difference in the measured resistance across the MEJ as between when its ferromagnetic layers have magnetic polarizations that are parallel and when they have magnetic polarizations that are antiparallel. Because a separate second dielectric layer is used to implement the VCMA effect, the dielectric layer separating the free and fixed layers can be selected primarily on the basis of enhancing this TMR effect.

Generally, dielectric materials that induce good spin filtering properties provide for enhanced TMR effects. In many embodiments, the dielectric layer is one of: $MgO$, $Al_2O_3$, and mixtures thereof. Of course any suitable dielectric layer can be used that allows the MEJ to have enhanced TMR effects.

Generally, both of the dielectric layers may contribute to both TMR and VCMA effects in the device. However, in many embodiments of this invention each one of the dielectric layers is designed to primarily enhance one of these properties.

Figure 7:
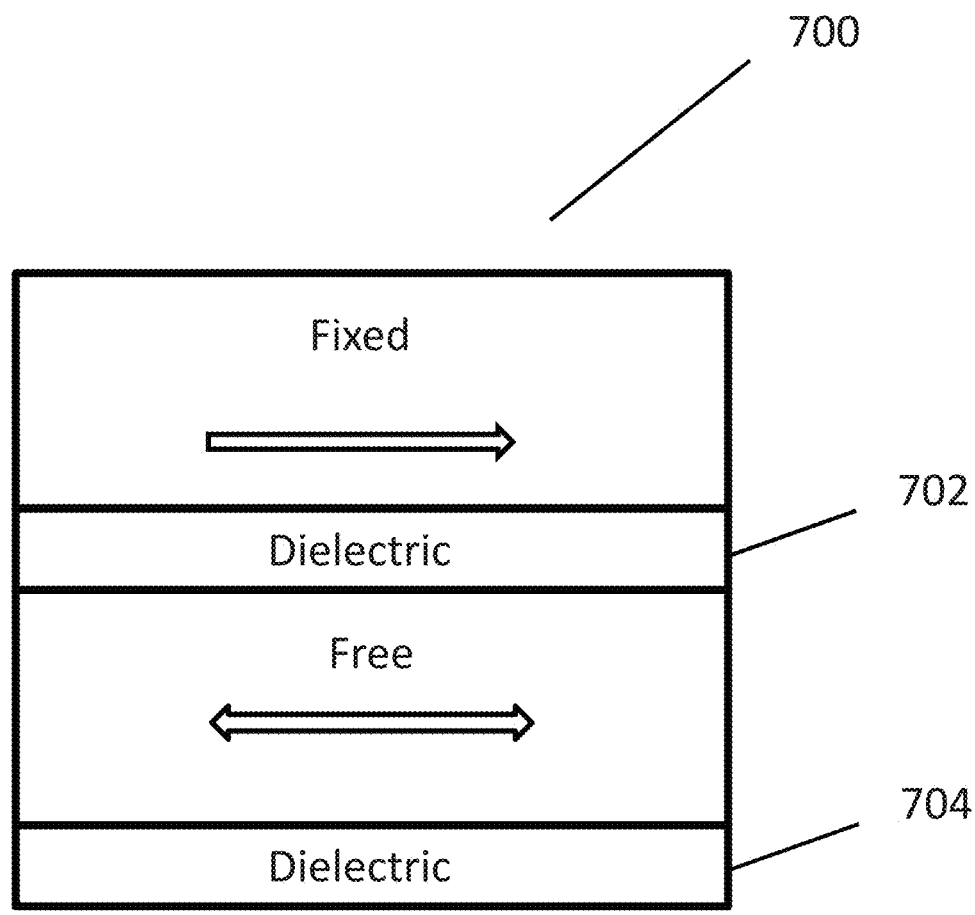
FIG. 7 illustrates an MEJ including two dielectric layers in accordance with embodiments of the invention.

FIG. 7 illustrates an MEJ including a second dielectric layer proximate the free layer that enhances the VCMA effect, in accordance with embodiments of the invention. In particular the MEJ 700 includes a first dielectric layer 702 interposed between the FM fixed layer and FM free layer of an MEJ, as well as a second dielectric layer 704 proximate the FM free layer. As alluded to above, the first dielectric layer can be any dielectric material that provides enhanced TMR effects. For example, the first dielectric material can be one of: $MgO$, $Al_2O_3$, and mixtures thereof. To be sure, the first dielectric material can be any suitable material that provides for viable MEJ operation. The second dielectric layer can be any dielectric material that provides enhanced VCMA effects. For example, the second dielectric layer could be one of: $HfO_2$, $ZrO_2$, $TiO_2$, $TaO_x$, $GdO_x$, and mixtures thereof. Additionally, thin atomic layers of material (not shown) that further enhance the VCMA effect can be inserted near the interface between the second dielectric layer and the free layer. In many embodiments, a material with a large spin-orbit coupling is inserted near the interface, e.g., one of: Ta, Hf, Pd, Pt, Gd, their respective oxides, and mixtures thereof.

Figure 8:
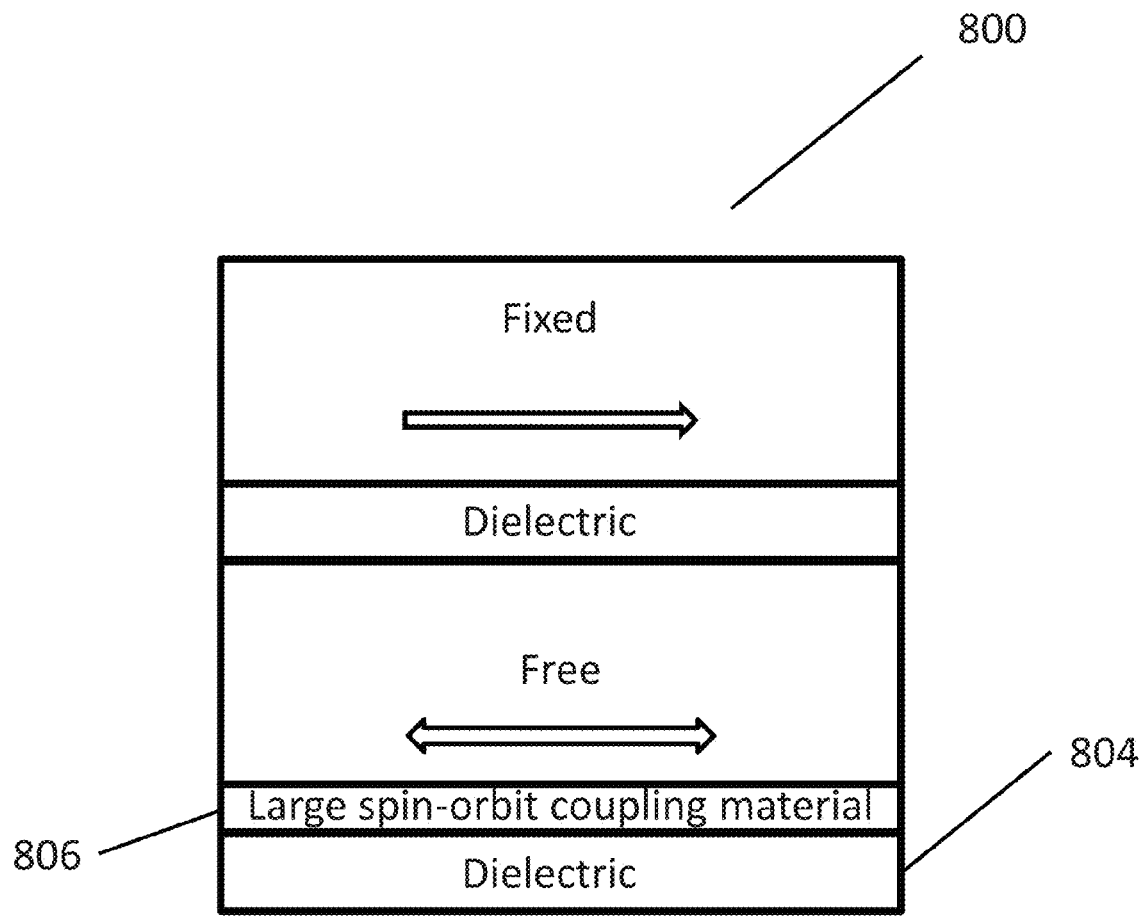
FIG. 8 illustrates an MEJ incorporating two dielectric layers and a large-spin orbit coupling material in accordance with embodiments of the invention.

FIG. 8 illustrates an MEJ having a second dielectric layer proximate the free layer, where a material that further enhances the VCMA effect is inserted between the second dielectric layer and the free layer in accordance with embodiments of the invention. In particular, the MEJ 800 is similar to that seen in FIG. 7, except that it further includes a layer of material 806 having a large spin-orbit coupling between the free layer and the second dielectric layer 804. Of course, it should be understood that any material having a large spin-orbit coupling can be implemented, e.g., one of: Ta, Hf, Pd, Pt, Gd, their respective oxides, and mixtures thereof. This arrangement can further enhance the VCMA effects that are facilitated by the second dielectric layer.

Moreover, in many embodiments, thin atomic layers of material are inserted proximate the first dielectric layer and the free layer. For example, one of: Ta, Hf, Pd, Pt, Gd, their respective oxides, and mixtures thereof can be used. In this way, the region proximate the first dielectric layer can contribute both to TMR effects (via the first dielectric layer) and VCMA effects (via the large-spin orbit coupling material). Indeed, in some embodiments, an MEJ does not rely on two distinct dielectric layers on each of two sides a free layer to provide for enhanced effects; instead, in these embodiments, an MEJ relies on the region proximate the dielectric layer interposed between the fixed layer and the free layer to provide both enhanced TMR effects and enhanced VCMA effects in the above-mentioned fashion, i.e. the dielectric layer provides for enhanced TMR effects while the large-spin orbit coupling material provides for enhanced VCMA effects.

Figure 9:
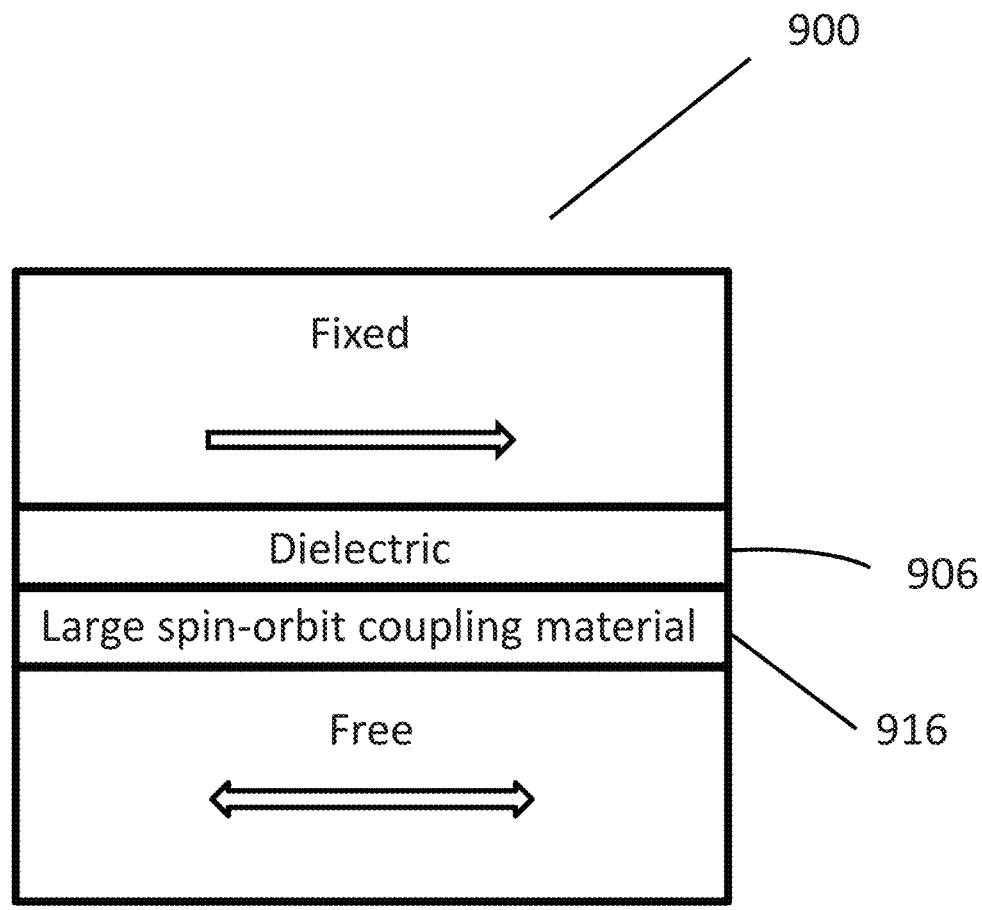
FIG. 9 illustrates an MEJ incorporating a dielectric layer interposed between a free and fixed layer, and a large spin-orbit coupling material proximate the dielectric layer in accordance with embodiments of the invention.

FIG. 9 illustrates an MEJ having a material that provides a VCMA effect proximate the dielectric layer interposed between the fixed layer and the free layer in accordance with embodiments of the invention. In particular, the MEJ is similar to that seen in FIG. 1, except that the MEJ further includes a layer of material 916 having a large spin-orbit coupling between the free layer and the dielectric layer 906. Of course, it should be understood that any material having a large spin-orbit coupling can be implemented, e.g., one of: Ta, Hf, Pd, Pt, Gd, their respective oxides, and mixtures thereof. Thus, the region proximate the dielectric layer 906 can provide enhanced TMR effects via the dielectric layer 906 and enhanced VCMA effects via the layer of material 916.

Figure 10:
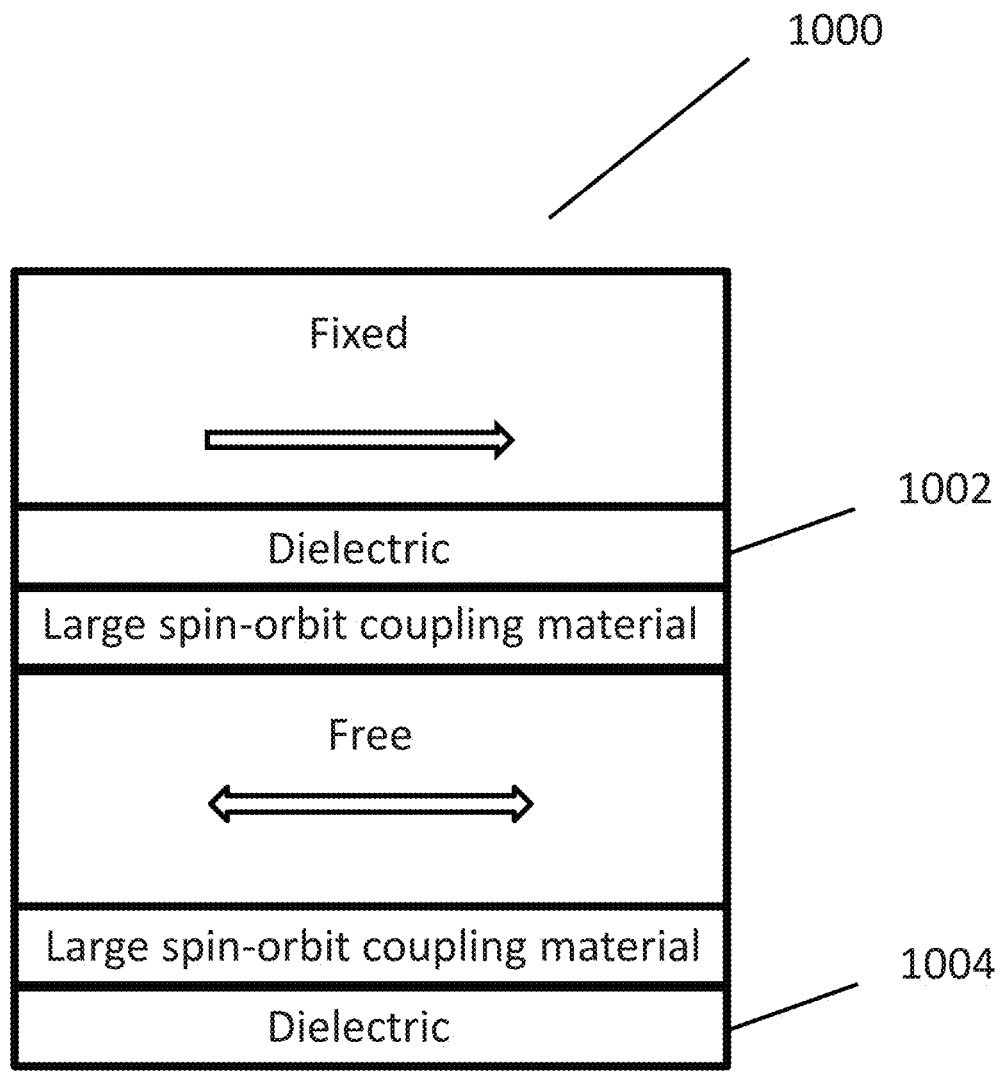
FIG. 10 illustrates an MEJ incorporating two dielectric layers and two large-spin orbit coupling layers of material in accordance with embodiments of the invention.

FIG. 10 illustrates an MEJ having two dielectric layers, and a material that enhances VCMA effects proximate each of the two dielectric layers in accordance with embodiments of the invention. In particular the MEJ 1000 is similar to that seen in FIG. 8, except that there is also a large spin-orbit coupling material proximate the first dielectric material. Having two layers of large spin-orbit coupling materials can further bolster VCMA effects.

Figure 11:
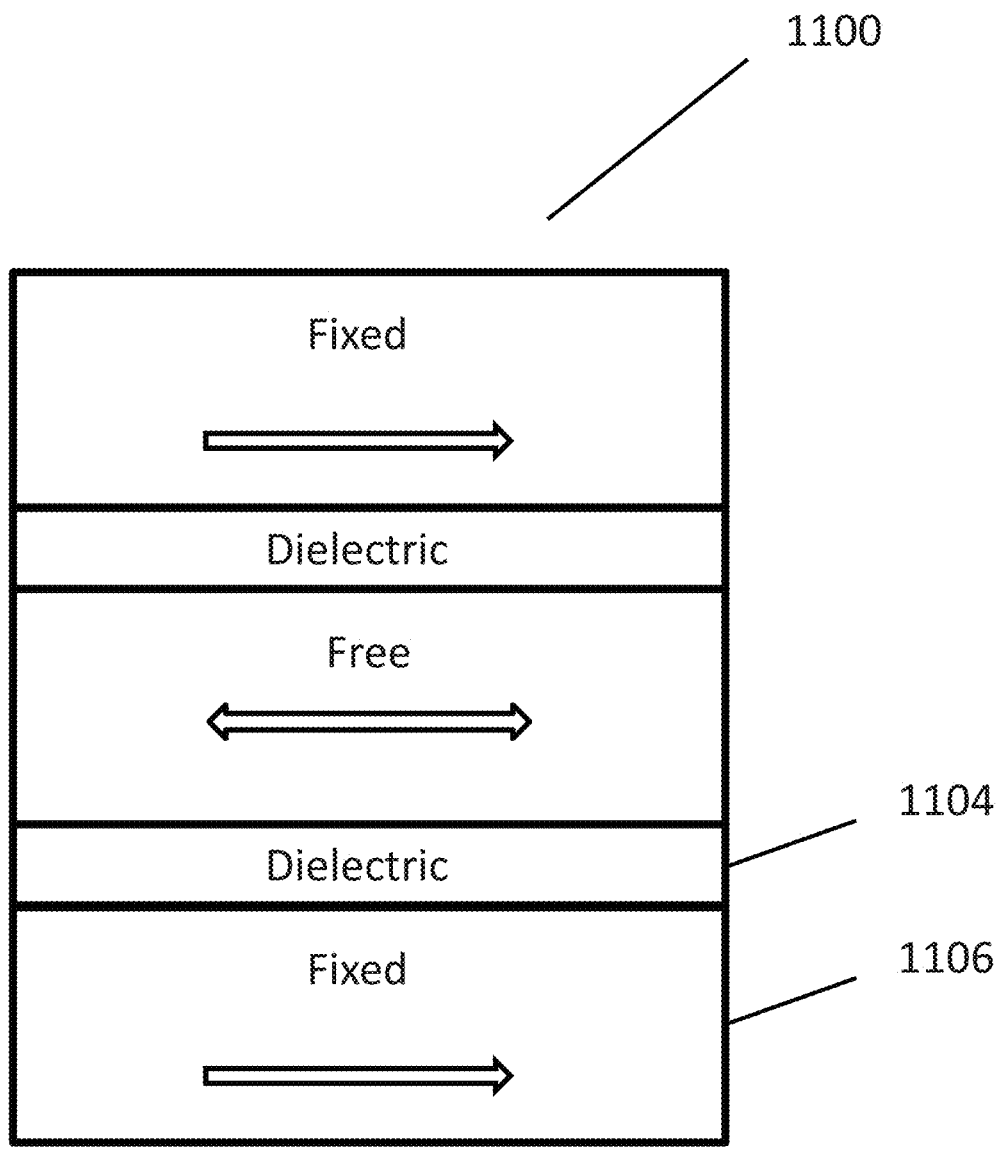
FIG. 11 illustrates an MEJ incorporating two dielectric layers and two fixed layers in accordance with embodiments of the invention.

Note that although several MEJ configurations in accordance with embodiments of the invention are discussed above, there exist many such configurations. For instance, in many embodiments MEJs having two dielectric layers include two fixed layers. Such a configuration can provide many benefits. For example, a second fix layer can help further establish an initial direction of polarization, and thereby provide better a TMR signal. FIG. 11 illustrates an MEJ having a second fixed layer in accordance with embodiments of the invention. In particular, the MEJ 1100 is similar to that seen in FIG. 7, except that it further includes a second fixed layer 1106 proximate the second dielectric layer 1104.

Additionally, in embodiments that implement two dielectric layers, one on each of two sides of a free layer, any of a number of different effects can be implemented to manipulate the interfaces of the free layer (i.e. one interface corresponding with a first side and a second interface corresponding with a second side) such that the VCMA effects corresponding with each of the two interfaces have different 'signs'. Here, the 'sign' of the VCMA effect refers to whether the anisotropy along a particular magnetic easy axis is reduced or increased for a specific polarity of potential difference applied to it (equivalently, specific sign of charges induced at the respective interface). By achieving opposite signs of the VCMA at the two interfaces, the overall VCMA effect can thus be increased. Methods to control the sign of the VCMA include control of the oxygen content at the interface, as mentioned above, as well as the addition of additional layers of appropriate materials at each interface, such as materials with high spin-orbit coupling, or their oxides, also mentioned above.

Of course, it should be understood that the these MEJs having improved readability and writeability can operate in accordance with the description provided in the section above titled "General Principles of MEJ Operation." Accordingly, it should be understood that any of the techniques discussed in that section can be implemented using the above-described MEJs having improved readability and writeability. For instance, in many embodiments, an MEJ having improved readability and writeability further includes a metal line adjacent to an FM free layer such that a current can pass through the metal line and induce spin-orbit torques that can result in spin-transfer torques, which can help impose a magnetic polarization on the FM free layer.

Figure 12:
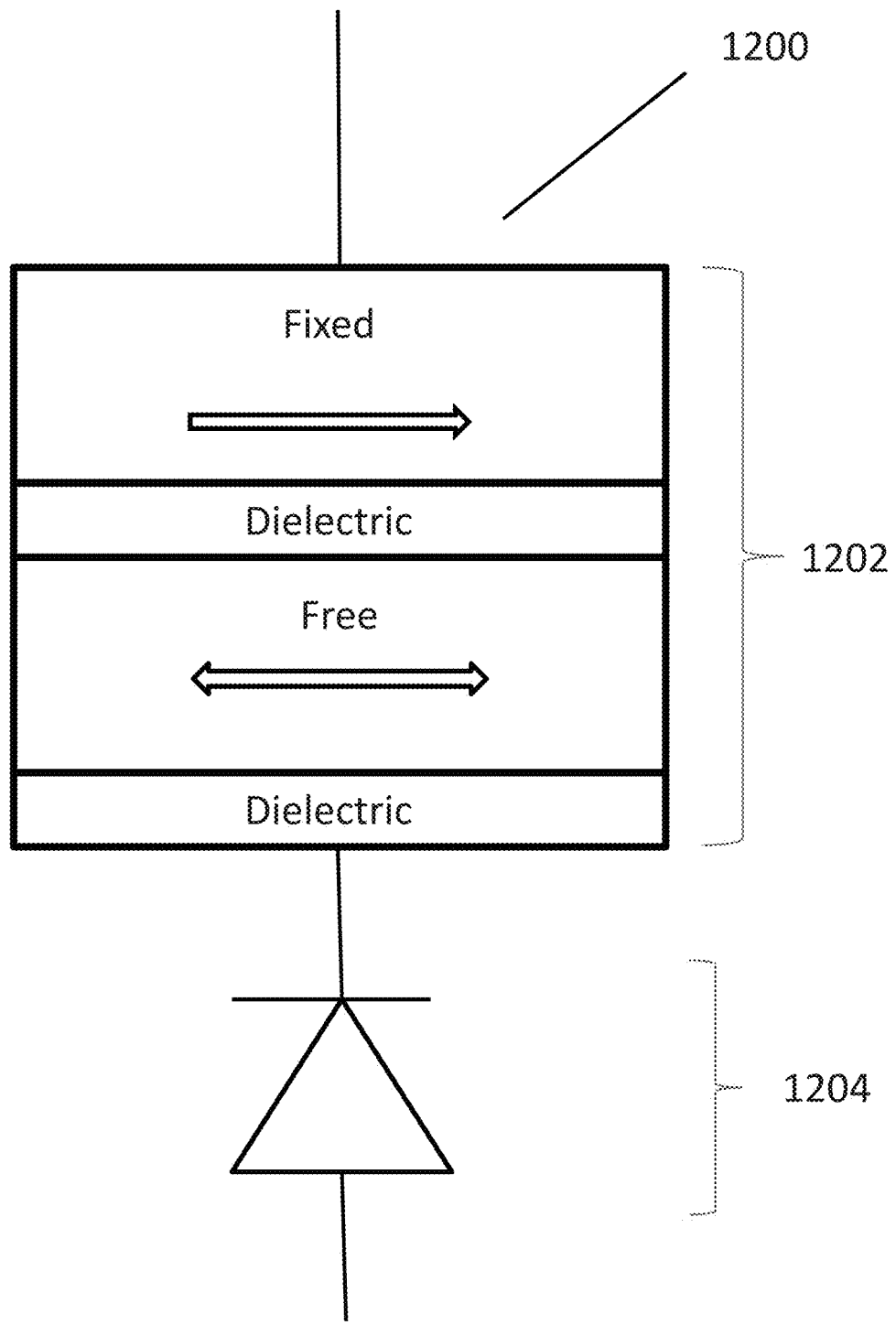
FIG. 12 illustrates a DIOMEJ cell incorporating two dielectric layers in accordance with embodiments of the invention.

Additionally, in accordance with the teachings of U.S. patent application Ser. No. 14/021,916, incorporated by reference above, the above-described MEJs with improved writing and reading characteristics can be coupled with a diode—the diode acting as the access device for the MEJ—to form a DIOMEJ cell in accordance with embodiments with the invention. FIG. 12 illustrates an MEJ having a second dielectric layer, as described above, coupled with a diode to form a DIOMEJ cell in accordance with embodiments of the invention. In particular, the DIOMEJ cell 1200 includes an MEJ 1202 having 2 dielectric layers, where the first dielectric layer is interposed between the fixed and free layers, and the second dielectric layer is proximate the free layer, and a diode 1204 coupled to the MEJ 1202 such that it can act as the access device. Note that the first dielectric layer provides for enhanced TMR in the MEJ, while the second dielectric layer provides for enhanced VCMA effects of the MEJ.

Figure 13:
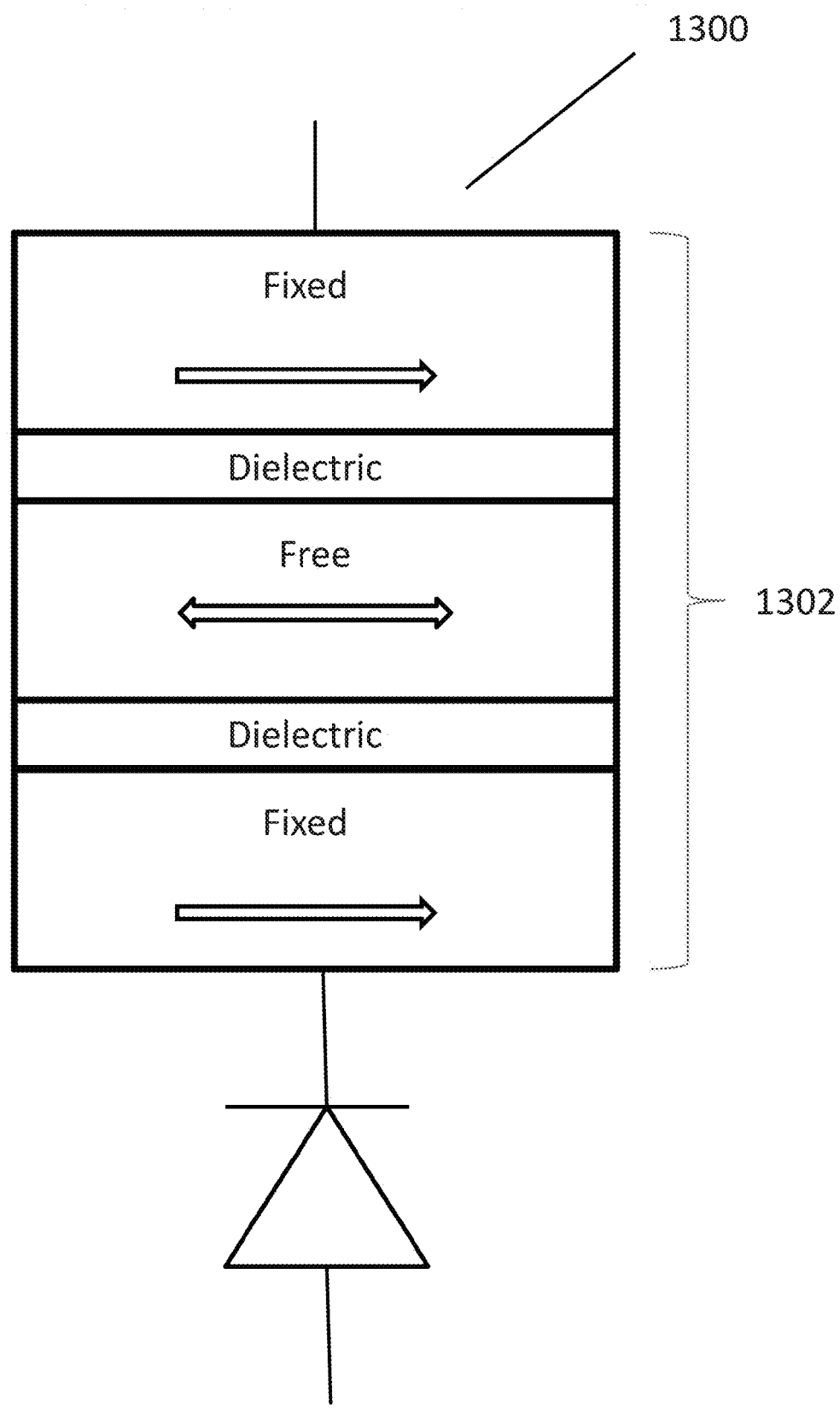
FIG. 13 illustrates a DIOMEJ cell incorporating two dielectric layers and two fixed layers in accordance with embodiments of the invention.

As can be inferred from the above discussion, MEJs of a DIOMEJ cell can also include multiple fixed layers in accordance with embodiments of the invention. FIG. 13 illustrates a DIOMEJ cell having an MEJ with two fixed layers. In particular, the DIOMEJ cell 1300 is similar to that seen in FIG. 12, except that the MEJ includes two fixed layers (akin to the MEJ seen in FIG. 11.) As mentioned above, MEJs having multiple fixed layers can be advantageous in many respects.

Additionally, MEJs of a DIOMEJ cell can include layers of large spin-orbit coupling material to provide for enhanced VCMA effects, as discussed previously, in accordance with embodiments of the invention.

The MEJs and DIOMEJ cells discussed above can be implemented in any number of applications. Some of these applications are now discussed below.

Applications for MEJs with Improved Writing and Reading Characteristics

Similar to the discussion in U.S. patent application Ser. No. 14/021,916, because of their form-factor and their energy efficiency, DIOMEJ cells disclosed in the instant application are particularly versatile and can be implemented in a host of applications. For example, DIOMEJ cells can be used as simple switches, incorporated in logic circuits, and used as a fundamental element in a MeRAM configurations.

Figure 14:
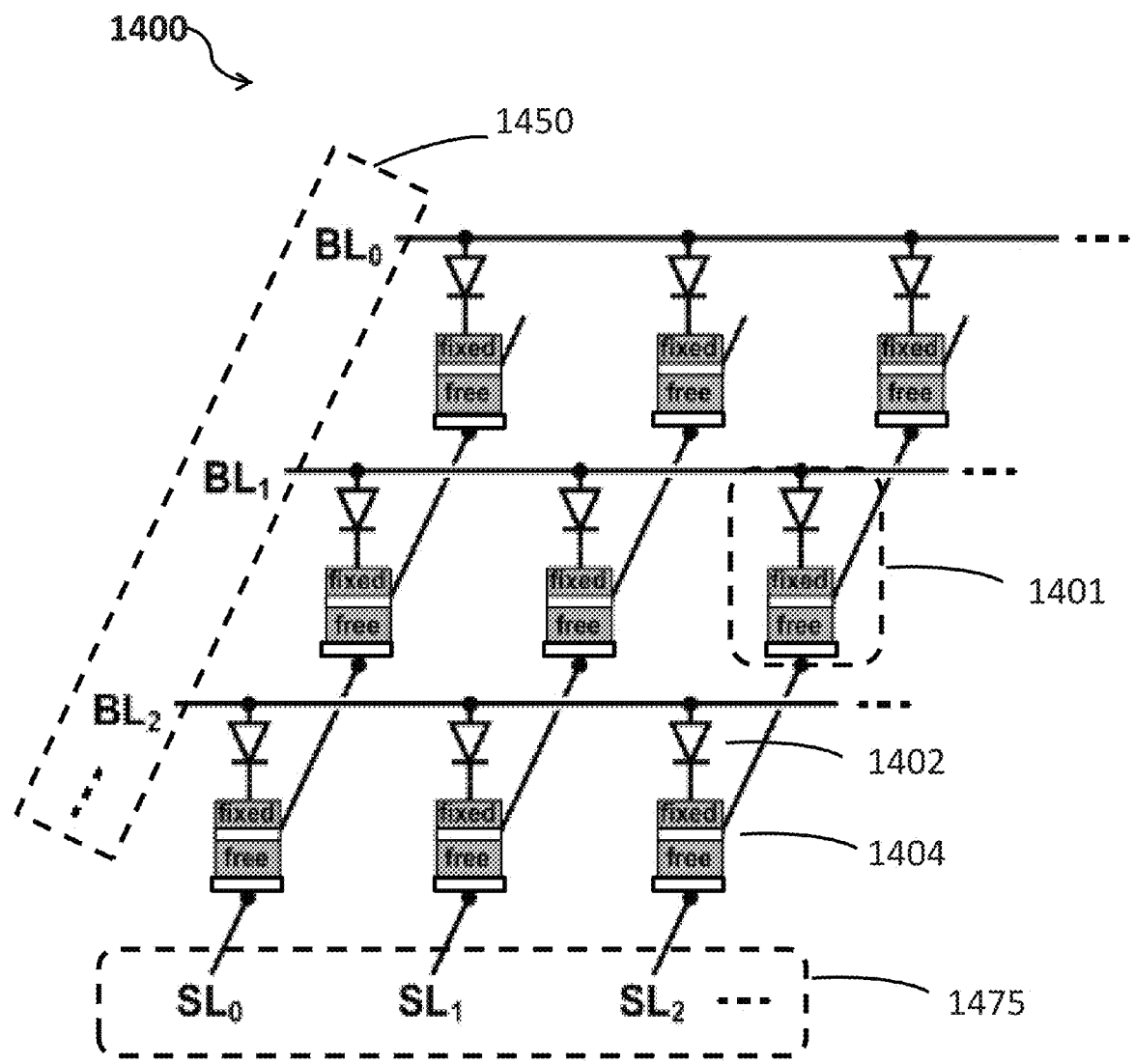
FIG. 14 illustrates a MERAM configuration that employs DIOMEJ in accordance with embodiments of the invention.

FIG. 14 illustrates how DIOMEJ cells of the instant application can be incorporated in a MeRAM configuration that employs a cross-bar architecture. In particular, the MeRAM crossbar array 1400 includes DIOMEJ cells 1401 that each have an MEJ 1404 having enhanced writing and reading characteristics (e.g. those that implement the above-discussed configurations) and a diode 1402 in electrical communication. The illustration shows a three by three array of DIOMEJ cells 1401, but of course it should be understood that an array of DIOMEJ cells of any size can be implemented in accordance with embodiments of the invention. In the illustrated embodiment, the anode of the diode 1402 is electrically coupled to one of an array of bit lines 1450, while the MEJ 1404 is electrically coupled to one of an array of source lines 1475. Although it should be understood that the MEJ 1404 can be coupled to an array of bit lines, while the anode of the diode can be coupled to one of an array of source lines. Of course, it is understood that the MEJs 1404 are configured for unipolar operation such that the DIOMEJ cells 1401 can function. Accordingly, new bits of information are written to an MEJ 1401 (i.e. information states are established in the MEJ), where a potential difference is established across a respective bit line in the array of bit lines 1450 and a respective source line in the array of source lines 1475. In this configuration, the diode 1402 acts as an access device. The use of diodes as access devices is advantageous insofar as they can prevent parasitic paths that may be present in a MeRAM configuration, and can relatedly improve reading of the DIOMEJ cells since the on/off resistance ratio will be improved. Note also, that the incorporation of diodes, instead of transistors, can allow DIOMEJ cells to be more densely packed, and thereby result in MeRAM with greater capacity.

Figure 15:
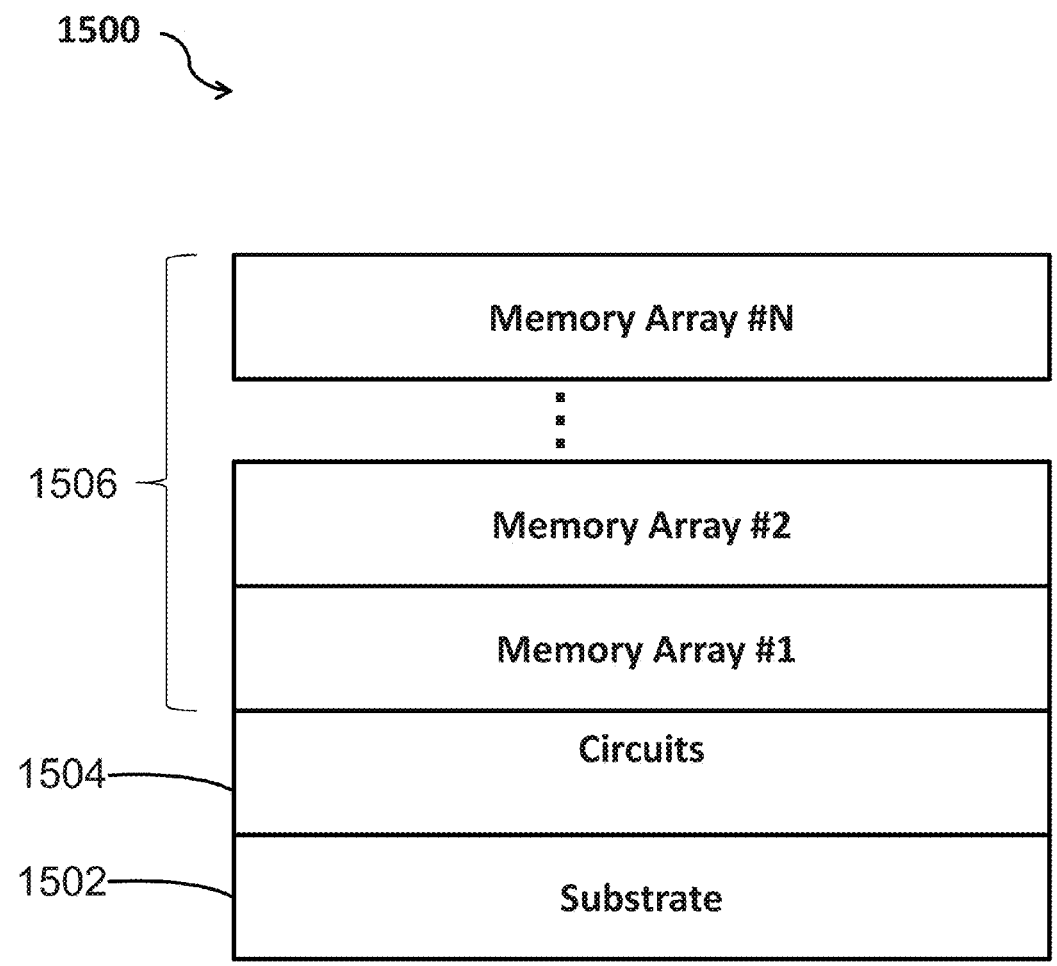
FIG. 15 illustrates a configuration that implements stacked arrays of DIOMEJ cells in accordance with embodiments of the invention

FIG. 15 depicts a stacked MeRAM configuration. In particular, the MeRAM configuration 1500 includes a substrate 1502, a layer of circuitry deposited on the substrate 1504, and layers of arrays of DIOMEJ cells configured to operate as memory deposited thereon 1506. The substrate layer 1502 simply functions as a structural base layer. The circuitry 1504 can be any circuitry suitable for implementation in a MeRAM configuration, and can include for instance: transistors, address circuits, decode circuits, read and write circuits, logic gates, and sense amplifier circuits to control and operate the cross-bar stacked memory array 1500. The ability to layer arrays of DIOMEJ cells is greatly facilitated by the DIOMEJ cells form-factor, and the layering can allow for a densely packed memory configuration.

Moreover, in many embodiments, MeRAM configurations exploit redundant memory bits that are used to record parity and to enable missing data to be reconstructed by an error-correcting code (ECC). Parity allows the detection of single-bit errors. One common error-correcting code, a SECDED Hamming code, allows a single-bit error to be corrected and, in the usual configuration, with an extra parity bit, double-bit errors to be detected. As DIOMEJ cells can be arranged relatively densely in a MeRAM configuration, the desire to incorporate redundant bits is not as burdensome in these configurations.

Figure 16:
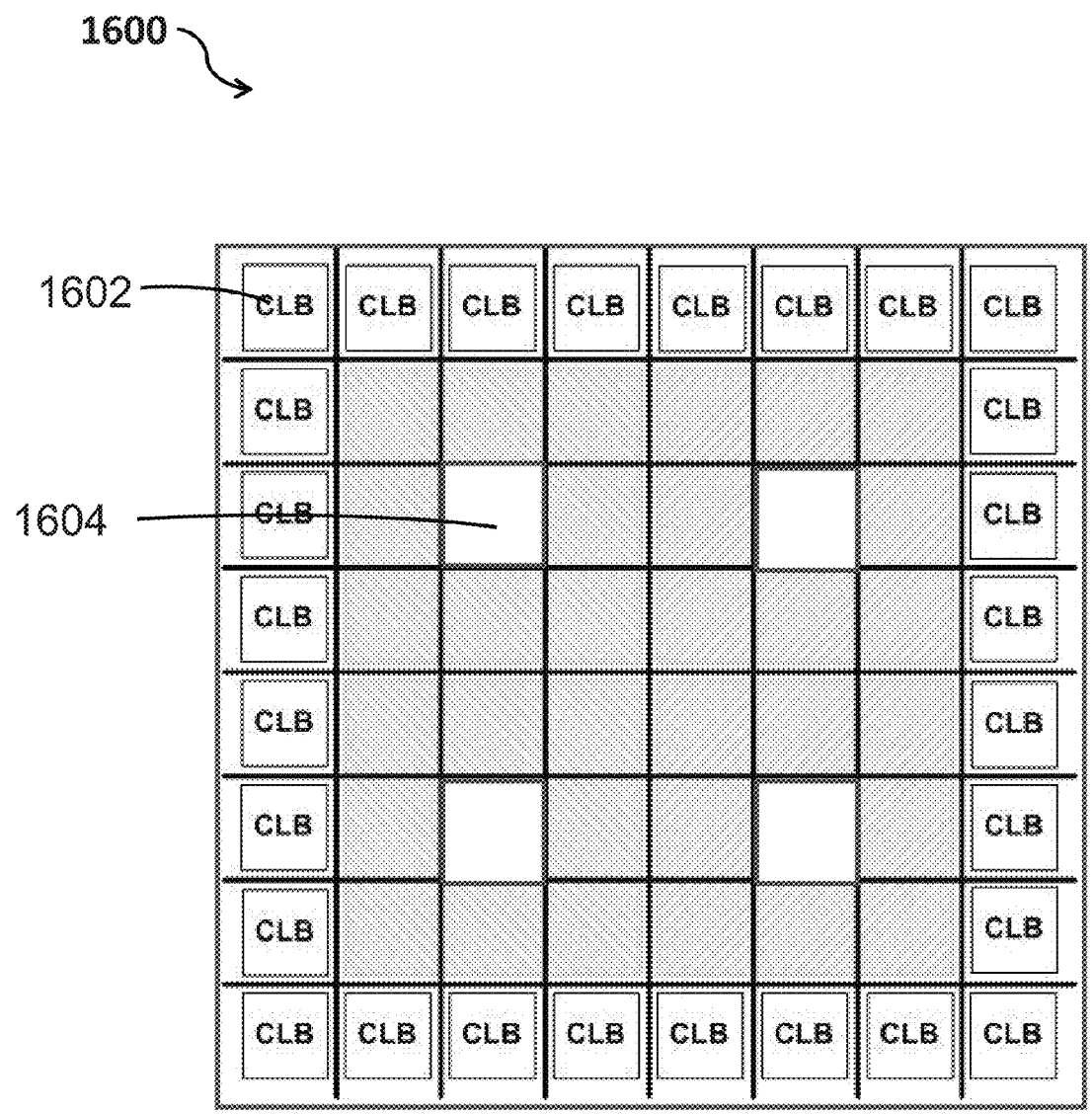
FIG. 16 illustrates a field programmable gate array that includes DIOMEJ cells in accordance with embodiments of the invention.

DIOMEJ cells of the instant application can also be incorporated in field programmable gate arrays (FPGAs) in accordance with embodiments of the invention. For example, DIOMEJ cells can be implemented in a hybrid FPGA that includes configurable logic blocks and embedded memory, along with other possible functions such as a DSP, floating point units, etc. FIG. 16 illustrates a hybrid FPGA that includes DIOMEJ cells that can be implemented in accordance with embodiments of the invention. In particular, the FPGA 1600 includes configurable logic blocks 1602, and DIOMEJ cells that are configured to act as memory 1604 (e.g. MeRAM configurations, as described above). The logic blocks 1602 can include look up tables that include memory made from the DIOMEJ cross-bar memory arrays or stacked DIOMEJ memory arrays 1604. The embedded memory 1604 is placed and routed together and formed in the center, with the configurable logic blocks 1602 located on the periphery of the embedded memory, 1604. This configuration eases interconnection (electrical wiring or traces) routing between an embedded memory block 1604, and an associated logic block, 1602. Alternatively, to make the capacitive and resistive load of the electric wiring/traces more uniform between each pair of embedded memory block 1604 and associated logic block 1502, the embedded memory blocks 1604 and logic blocks 1602 are interleaved and placed in a checkerboard or island pattern.

Upon startup, the FPGA 1600 is programmed so that its logic blocks 1502 have the needed logic gates to perform certain functions. To ensure security, instead of programming an FPGA from an external source where a bit stream might be monitored and captured by an enemy or competitor or thief, if the embedded memory 1604 is compact and dense enough, multiple bit stream instructions may be stored, one on each embedded memory unit. Then, upon startup it would only be necessary to transmit one code to select an appropriate algorithm that is stored in a particular embedded memory unit to program the FPGA 1600 to perform a particular function. Moreover, the FPGA configuration (i.e. the configuration in the logic blocks 1602) can be readily changed on the fly, while a mission is in transit or in operation, if all the possible algorithms of programming the FPGA 1600 are stored in the embedded memory 1604. This type of application benefits from the non-volatile nature of the DIOMEJ cross-bar memory arrays or stacked arrays. Due to its highly flexible properties, the hybrid FPGA can be used in products for security, communications, data processing, industrial plants and manufacturing, military and aerospace, consumer electronics and the entertainment industry, and automotive. Specific products include mobile phones, tablets, computers, digital cameras, digital audio players, synthesizers, video games, scientific instrumentation, industrial robotics, medical electronics, smart weapons, laser-radars, un-manned air vehicles and so on.

The above-described MEJs and DIOMEJ cells can be fabricated using any suitable techniques. For example, any of the fabrication techniques disclosed in U.S. patent application Ser. No. 14/021,916 can be used. The fabrication of MEJs and DIOMEJ cells is now discussed below.

Fabrication

Figure 17:
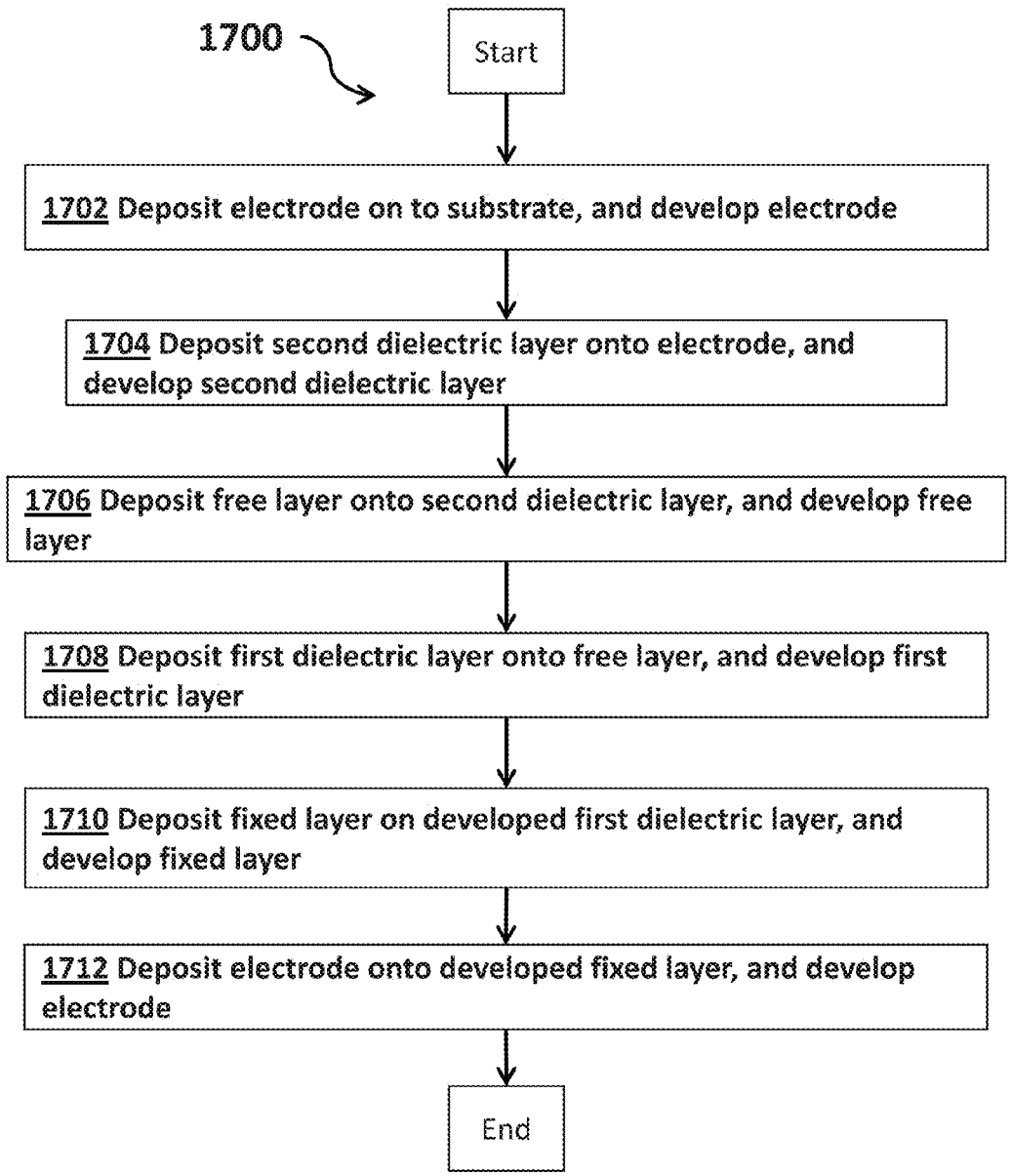
FIG. 17 illustrates a process for fabricating an MEJ having two dielectric layers in accordance with embodiments of the invention.

Generally, in many embodiments of the invention, MEJs and DIOMEJ cells are fabricated by sequentially depositing their constituent layers onto a substrate. Thus, for instance in some embodiments, a DIOMEJ cell is fabricated by first depositing layers of an MEJ on a substrate, and subsequently depositing layers that constitute the diode. Of course, where only the MEJ is desired, then the deposition of layers constituting the diode would be omitted. FIG. 17 illustrates a process for fabricating an MEJ having improved writing and reading characteristics that includes a free layer, a fixed layer, and a first and second dielectric layer. Generally, in accordance with the process 1700, an electrode is deposited 1702 onto a substrate, and developed so that it has the desired properties. Any suitable methods of treatment can be used to develop the electrode, e.g. annealing, polishing, or any of the above mentioned treatments. A second dielectric layer of an MEJ is deposited 1704 on to the developed electrode; it may also be developed so that it has the desired properties using any suitable technique. For example, thin atomic layers of a material having a large spin-orbit coupling can be coated onto the dielectric layer. A free layer is deposited 1706 onto the developed second dielectric layer; it may also be developed so that it has the desired properties using any suitable technique. A first dielectric layer is deposited 1708 onto the developed free layer; it may also be developed so that it has the desired properties using any suitable technique. A fixed layer is deposited 1710 onto the developed first dielectric layer; it may also be developed so that it has the desired properties using any suitable technique. An electrode layer is deposited 1712 onto the developed fixed layer; it may also be developed so that it has the desired properties using any suitable technique. Alternatively, some of the development steps may be combined or skipped as needed during the fabrication process. For example, if development of the layers involves high-temperature annealing, this may be done all at once after deposition of the entire stack, so that it affects the properties of all layers, or alternatively, after deposition of one of the MEJ free, fixed and dielectric layers such as to only affect the properties of some of the MEJ layers.

Figure 18:
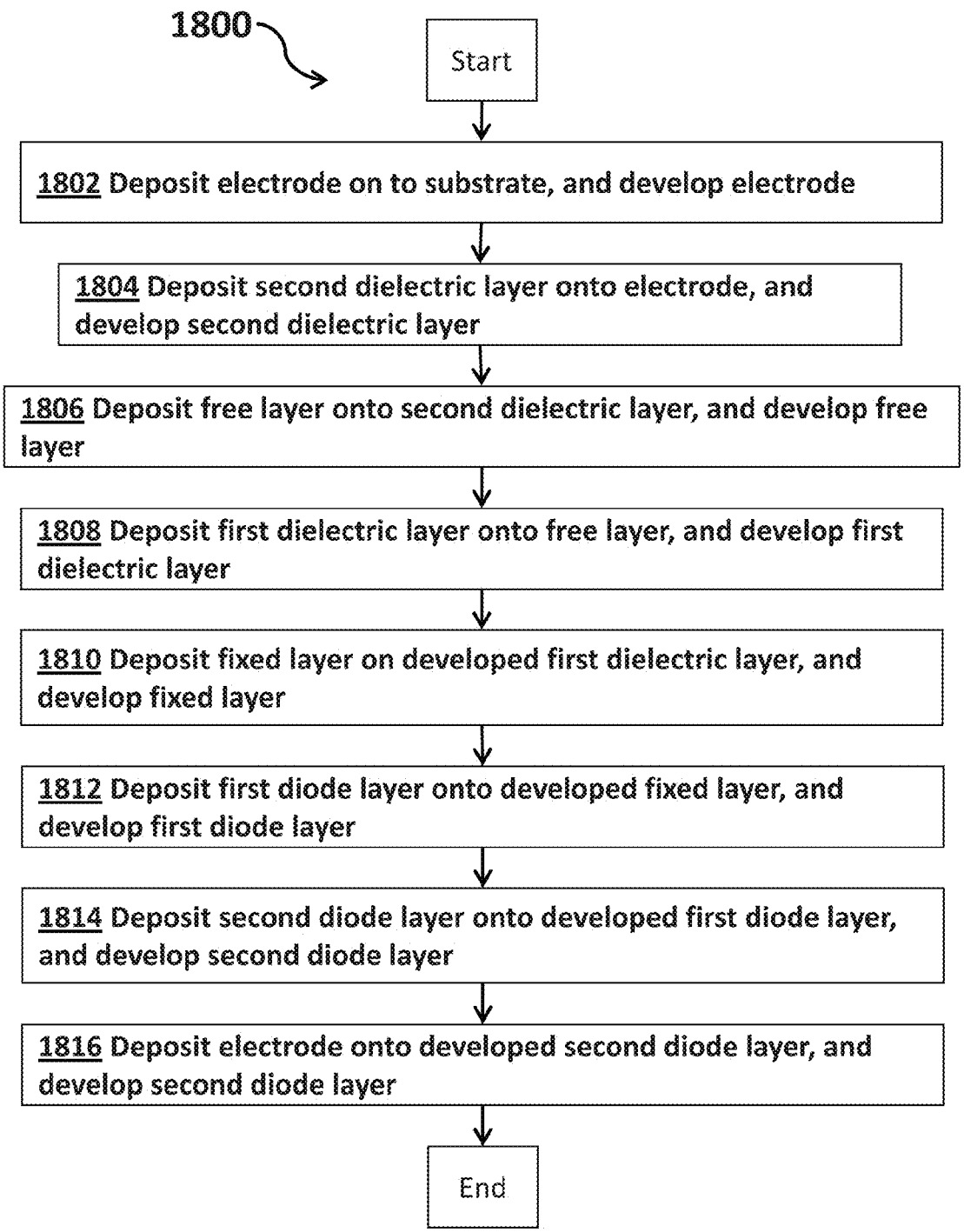
FIG. 18 illustrates a process for fabricating a DIOMEJ cell having two dielectric layers in accordance with embodiments of the invention.

As can be inferred, processes similar to the one described above can be used to fabricate the disclosed DIOMEJ Cells. For example, FIG. 18 illustrates a process for fabricating a DIOMEJ having improved writing and reading characteristics that includes a free layer, a fixed layer, and a first and second dielectric layer, in series with a diode. Generally, in accordance with the process 1800, an electrode is deposited 1802 onto a substrate, and developed so that it has the desired properties. Any suitable methods of treatment can be used to develop the electrode, e.g. annealing, polishing, or any of the above mentioned treatments. A second dielectric layer of an MEJ is deposited 1804 on to the developed electrode; it may also be developed so that it has the desired properties using any suitable technique. For example, thin atomic layers of a material having a large spin-orbit coupling can be coated onto the dielectric layer. A free layer is deposited 1806 onto the developed second dielectric layer; it may also be developed so that it has the desired properties using any suitable technique. A first dielectric layer is deposited 1808 onto the developed free layer; it may also be developed so that it has the desired properties using any suitable technique. A fixed layer is deposited 1810 onto the developed first dielectric layer; it may also be developed so that it has the desired properties using any suitable technique. A first diode layer is deposited 1812 onto the developed fixed layer; it may also be developed so that it has the desired properties using any suitable technique. A second diode layer is deposited 1814 onto the developed first diode layer; it may also be developed so that it has the desired properties using any suitable technique. An electrode layer is deposited 1816 onto the developed first diode layer; it may also be developed so that it has the desired properties using any suitable technique. Alternatively, some of the development steps may be combined or skipped as needed during the fabrication process. For example, if development of the layers involves high-temperature annealing, this may be done all at once after deposition of the entire stack, so that it affects the properties of all layers, or alternatively, after deposition of the MEJ free, fixed and dielectric layers, but before deposition of the diode layers, such as to only affect the properties of the MEJ layers.

Of course, the illustrated processes for manufacturing MEJs and DIOMEJ cells are meant to be illustrative. It is of course to be understood that many variations of this process can be implemented in accordance with embodiments of the invention. For instance, in many embodiments, the diode is electrically coupled to the free layer as opposed to the fixed layer. In some embodiments, a layer of metal is installed in between the MEJ and the diode. In a number of embodiments, the fixed and free layers include capping or seed materials. Thus many variations of the process of manufacturing DIOMEJ cells can be implemented in accordance with embodiments of the invention.

While certain features of the implementations have been illustrated and described herein, modifications, substitutions, changes and equivalents will occur to those skilled in the art. It is, therefore, to be understood that the claims are intended to cover all such modifications and changes that fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described. For example, the MEJs discussed may be modified, but still consistent with the principles described herein. It is to be understood that the magnetoelectric elements and arrays can be utilized in different embodiments and applications that may require tweaking to fit a particular situation and set of electronics.

What is claimed is:

1. A magnetoelectric junction comprising:
   a ferromagnetic fixed layer;
   a ferromagnetic free layer that is magnetically anisotropic;
   a first dielectric layer interposed between the ferromagnetic fixed layer and the ferromagnetic free layer; and
   a second dielectric layer disposed proximate the ferromagnetic free layer;
   wherein the ferromagnetic fixed layer is magnetically polarized in a first direction;
   wherein the ferromagnetic free layer has a first easy axis that is substantially aligned with the first direction, such that the ferromagnetic free layer can adopt a magnetic polarity that is either parallel with or antiparallel with the first direction; and
   wherein the magnetoelectric junction is configured such that when a potential difference is applied across the magnetoelectric junction, the magnetic anisotropy of the ferromagnetic free layer is altered such that the relative strength of the magnetic anisotropy along a second easy axis that is orthogonal to the first easy axis, or the easy plane where there is no easy axis that is orthogonal to the first easy axis, as compared to the strength of the magnetic anisotropy along the first easy axis, is magnified or reduced for the duration of the application of the potential difference;
   wherein the extent of the magnification or reduction of the relative strength is enhanced by the presence of the second dielectric layer.

2. The magnetoelectric junction of claim 1, wherein the first direction coincides with an in-plane direction.

3. The magnetoelectric junction of claim 1, wherein the first direction coincides with an out-of-plane direction.

4. The magnetoelectric junction of claim 1, wherein the coercivity of the ferromagnetic free layer is reduced when a potential difference is applied across the magnetoelectric junction.

5. The magnetoelectric junction of claim 4, wherein the application of a first threshold potential difference across the ferromagnetic fixed layer and the ferromagnetic free layer reduces the coercivity of the ferromagnetic free layer to an extent where the strength of the magnetic field imposed by the ferromagnetic fixed layer is sufficient to cause the ferromagnetic free layer to adopt a magnetic polarity that is determined by that of the ferromagnetic fixed layer.

6. The magnetoelectric junction of claim 5, wherein the application of a second threshold potential difference that is greater in magnitude than the first threshold potential difference causes a spin-transfer torque current to flow through the magnetoelectric junction; wherein the spin-transfer torque current causes the ferromagnetic free layer to adopt a magnetic polarity that is in a direction antiparallel with the first direction.

7. The magnetoelectric junction of claim 1, wherein the ferromagnetic fixed layer comprises one of: iron, nickel, manganese, cobalt, FeCoB, FeGaB, FePd, FePt, and mixtures thereof.

8. The magnetoelectric junction of claim 1, wherein the ferromagnetic free layer comprises one of: iron, nickel, manganese, cobalt, FeCoB, FeGaB, FePd, FePt, and mixtures thereof.

9. The magnetoelectric junction of claim 1, wherein the first dielectric layer comprises one of: $MgO$, $Al_2O_3$, and mixtures thereof.

10. The magnetoelectric junction of claim 1, wherein the second dielectric layer comprises one of: $MgO$, $Al_2O_3$, $HfO_2$, $ZrO_2$, $TiO_2$, $TaO_x$, $GdO_x$, and mixtures thereof.

11. The magnetoelectric junction of claim 1, further comprising an externally applied magnetic field that is either parallel with or antiparallel with the magnetic polarization of the ferromagnetic fixed layer, wherein the externally applied magnetic field has a strength sufficient to cause the ferromagnetic free layer to adopt a magnetic polarity in a direction that is parallel with that of the externally applied magnetic field when the coercivity of the ferromagnetic free layer is reduced with the application of a potential difference across the ferromagnetic fixed layer and the ferromagnetic free layer.

12. The magnetoelectric junction of claim 1, further comprising a second ferromagnetic fixed layer, wherein the second ferromagnetic fixed layer is disposed proximate the second dielectric layer.

13. The magnetoelectric junction of claim 1, wherein the ferromagnetic free layer has a first side and an opposing second side, wherein voltage controlled magnetic anisotropy effects that are manifested at the first side and the opposing second side during the application of the potential difference, are cumulative.

* * * * *